(12) United States Patent
Chen et al.

(10) Patent No.: US 10,193,533 B2
(45) Date of Patent: Jan. 29, 2019

(54) METHODS AND SYSTEMS FOR EVENT-DRIVEN RECURSIVE CONTINUOUS-TIME DIGITAL SIGNAL PROCESSING

(71) Applicant: THE TRUSTEES OF COLUMBIA UNIVERSITY IN THE CITY OF NEW YORK, New York, NY (US)

(72) Inventors: Yu Chen, New York, NY (US); Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/678,424

(22) Filed: Aug. 16, 2017

(65) Prior Publication Data
US 2018/0054186 A1   Feb. 22, 2018

Related U.S. Application Data

(60) Provisional application No. 62/376,112, filed on Aug. 17, 2016.

(51) Int. Cl.
*H03H 17/04* (2006.01)
*H03H 17/02* (2006.01)
*H03H 17/00* (2006.01)

(52) U.S. Cl.
CPC ........ *H03H 17/04* (2013.01); *H03H 17/0009* (2013.01); *H03H 17/02* (2013.01); *H03H 2017/0298* (2013.01)

(58) Field of Classification Search
CPC .............................. H03H 17/04; H03H 17/02
See application file for complete search history.

(56) References Cited

U.S. PATENT DOCUMENTS

| | | | |
|---|---|---|---|
| 7,132,972 B2 | 11/2006 | Tsividis | |
| 7,298,310 B2 | 11/2007 | Tsividis | |
| 8,749,421 B2 | 6/2014 | Kurchuk et al. | |
| 9,184,757 B2 | 11/2015 | Kurchuk et al. | |
| 9,344,107 B1 * | 5/2016 | Morche ................ | H03M 3/368 |
| 2006/0028365 A1 * | 2/2006 | Tsividis ................ | G06F 7/5443 |
| | | | 341/143 |

OTHER PUBLICATIONS

Agarwal et al., "A 320mV-to-1.2V On-Die Fine-Grained Reconfigurable Fabric for DSP/Media Accelerators in 32nm CMOS," 2010 IEEE International Solid-State Circuits Conference, Digest of Technical Papers, 328-329 and ISSCC 2010 Paper Continuations page (2010).

(Continued)

*Primary Examiner* — Chuong D Ngo
(74) *Attorney, Agent, or Firm* — Wilmer Cutler Pickering Hale and Dorr LLP

(57) ABSTRACT

Continuous-time digital systems implemented with separate timing paths and data paths are disclosed. The disclosed continuous-time digital systems, can implement an event-grouping and detection method that can be used feedback systems with propagation delays. By implementing event-detection into a feedback loop of a continuous-time digital system, the system can automatically stop when there is no event in the system. When new events are detected the system can commence operation.

24 Claims, 22 Drawing Sheets

(56) References Cited

OTHER PUBLICATIONS

Chen et al., "Design of Tunable Digital Delay Cells," 2017 IEEE Custom Integrated Circuits Conference (CICC), Date of Conference: Apr. 30-May 3, 2017 (4 pages).
Chen et al., "A Continuous-Time Digital IIR Filter with Signal-Derived Timing, Agile Power Dissipation and Synchronous Output," 2017 Symposium on VLSI Circuits, Date of Conference: Jun. 5-8, 2017 (2 pages).
Dieter et al., "Power Reduction by Varying Sampling Rate," Proceedings of the 2005 International Symposium on Low Power Electronics and Design, ISLPED '05, pp. 227-232 (2005).
Kurchuk et al., "Event-Driven GHz-Range Continuous-Time Digital Signal Processor With Activity-Dependent Power Dissipation," IEEE Journal of Solid-State Circuits, vol. 47, No. 9, pp. 2164-2173 (Sep. 2012).
Kurchuk et al., "GHz-Range Continuous-Time Programmable Digital FIR with Power Dissipation that Automatically Adapts to Signal Activity," 2011 IEEE International Solid-State Circuits Conference, Digest of Technical Papers, pp. 232-233 and ISSCC 2011 Paper Continuations page (2011).
Kurp et al., "An Adaptive Sampling Scheme for Improved Energy Utilization in Wireless Sensor Networks," 2010 IEEE Instrumentation and Measurement Technology Conference (IMTC), 6 pages (2010).
Mostafa and El-Hagry, "Adaptive Sampling of Speech Signals," IEEE Transactions on Communications, vol. com-22, No. 9, pp. 1189-1194 (Sep. 1974).

O'hAnnaidh et al., "A 3.2GHz-Sample-Rate 800MHz Bandwidth Highly Reconfigurable Analog FIR Filter in 45nm CMOS," 2010 IEEE International Solid-State Circuits Conference, Digest of Technical Papers, pp. 90-91 and ISSCC 2010 Paper Continuations page (2010).
Schell and Tsividis, "A Clockless ADC/DSP/DAC System with Activity-Dependent Power Dissipation and No Aliasing," 2008 IEEE International Solid-State Circuits Conference, Digest of Technical Papers pp. 550-551, 635 (2008).
Schell and Tsividis, "A Continuous-Time ADC/DSP/DAC System With No Clock and With Activity-Dependent Power Dissipation," IEEE Journal of Solid State Circuits, vol. 43, No. 11, pp. 2472-2481 (Nov. 2008).
Tohidian et al., "A 2mW 800MS/s 7th-Order Discrete-Time IIR Filter with 400kHz-to-30MHz BW and 100dB Stop-Band Rejection in 65nm CMOS," 2013 IEEE International Solid-State Circuits Conference, Digest of Technical Papers, pp. 174-175 and ISSCC 2013 Paper Continuations page (2013).
Tsividis "Continuous-time digital signal processing," Electronics Letters, vol. 39, No. 21, 2 pages (Oct. 16, 2003).
Tsividis, "Event-Driven Data Acquisition and Digital Signal Processing—A Tutorial," IEEE Transactions on Circuits and Systems—II: Express Briefs, vol. 57, No. 8, pp. 577-581 (Aug. 2010).
Vezyrtzis et al., "A flexible, clockless digital filter," 2013 Proceedings of the ESSCIRC, pp. 65-68 (2013).
Vezyrtzis et al., "A Flexible, Event-Driven Digital Filter With Frequency Response Independent of Input Sample Rate," IEEE Journal of Solid-State Circuits, vol. 49, No. 10, pp. 2292-2304 (Oct. 2014).

\* cited by examiner

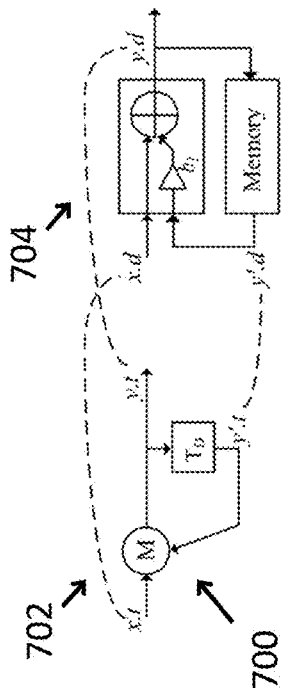
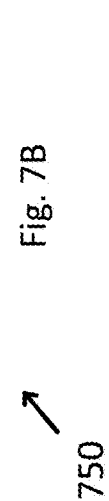
Fig. 7A
Fig. 7B
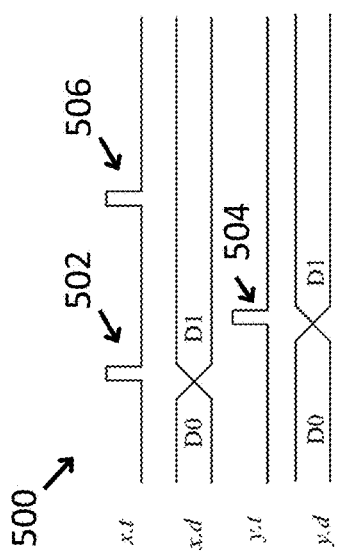
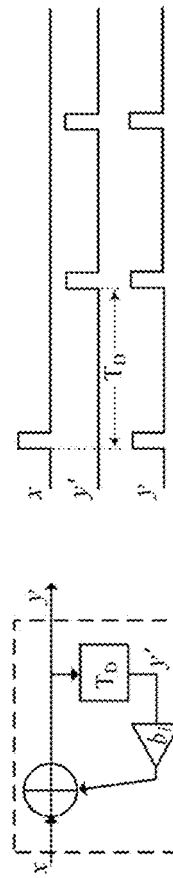
Fig. 5
Fig. 6A
Fig. 6B

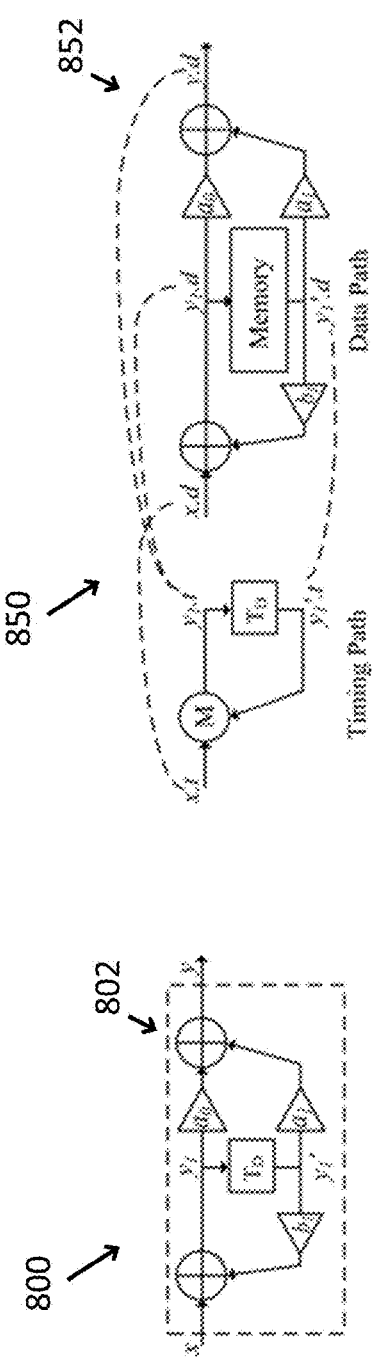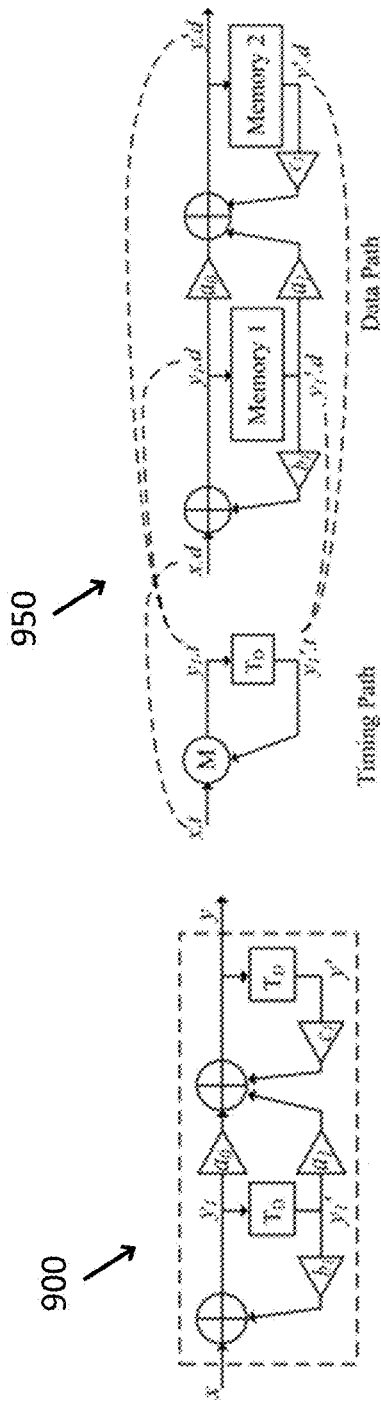
Fig. 8B
Fig. 9B
Fig. 8A
Fig. 9A

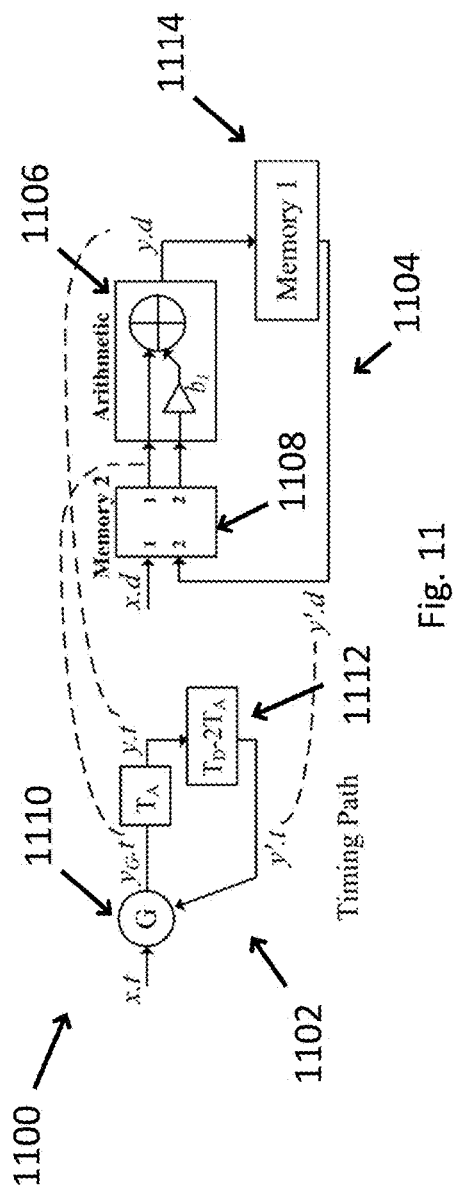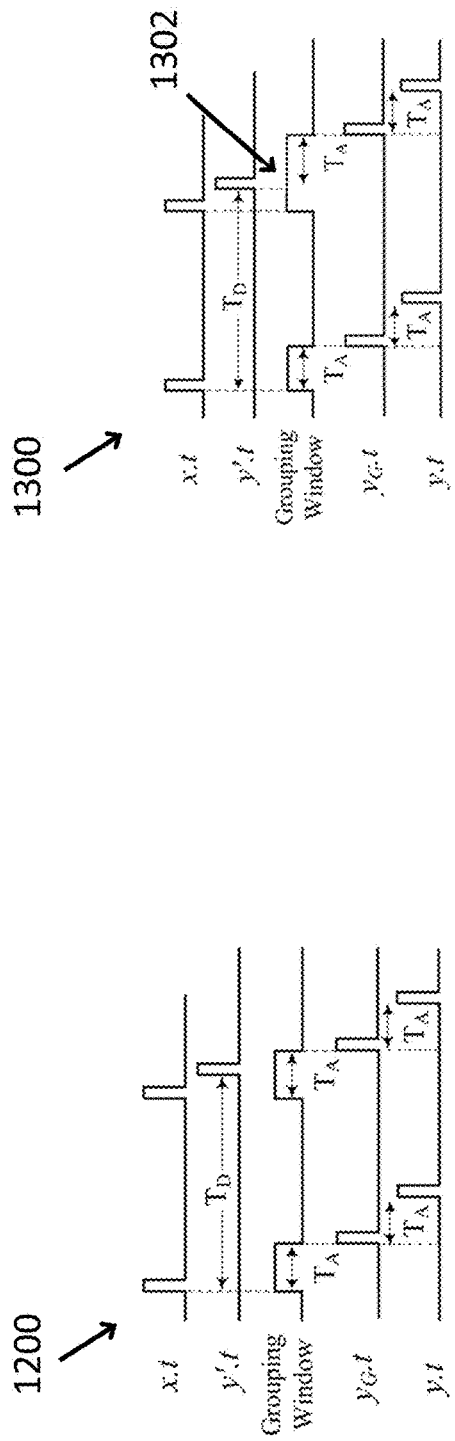
Fig. 11
Fig. 12
Fig. 13

| Parameter | O'hAnnaidh | Tohidian | Agarwal | Schell | Kurchuk | Vezyrtzis | Disclosed IIR |
|---|---|---|---|---|---|---|---|
| Signal domain | Analog | DT analog | DT digital | Async. | CT digital | Async. | CT digital |
| Output/clock freq. | FIR/15* | IIR/7* | Sync/ 2.1 GHz | FIR/15* | Async. | FIR/15* | Sync/ 1 MHz* |
| Type/order | 45 nm | 65 nm | IIR/3* | FIR/15* | FIR/5* | 130 nm | IIR/4* |
| Process | 1.1 V | 1.2 V | 32 nm | 90 nm | 65 nm | 1 V | 65 nm |
| Supply | 6 bits | 8 bits | 1 V | 1 V | 1.2 V | 8 bits | 1.2 V |
| DSP arithmetic resolution | 22 dB | >100 dB | 8 bits | 8 bits | 4 bits | 25 dB | 16 bits |
| Stop-band rejection | 33 dB | 41 dB | NA | 35 dB | 15 dB | 40-51 dB | 80 dB |
| SNDR | -41 dB† | | 50 dB | 47-62 dB | 20-22 dB | -50 dB | >64 dB |
| In-band IM3 | -43 dB† | | | -51 dB | -27 dB | | -59 dB |
| Out-band IM3 | 3.2 Gsps | 800 Msps | 2.1 Gsps | 17 MHz | -22 dB | 10 Msps | -57.6 dB |
| Max input rate | 46 mW*** | 1.96 mW*** | 24 mW~ | 310 μW/ 3 mW | 45 GHz | 70 μW/ 3.3 mW | 20 Msps |
| Power (Min/Max)† | 27 fJ | 0.36 fJ | 1.3 fJ | 1.2 pJ | 270 μW/ 9.2 mW | 1.6 fJ | 40 μW/ 2.32 mW |
| FoM (Min/Max)† | | | | 12 pJ | 0.1 fJ | 70 fJ | 0.06 fJ |
| | | | | | 4.3 fJ | | 2.9 fJ |
| Antialiasing filter required for complete system? | Yes | Yes | Yes | No | No | No | No |

*For CT-to-DT converter only. **Not including clock generation and anti-aliasing filter.
†Varying with signal activity, without power down circuitry.
‡Inferred from IIP3 measurements, assuming full-scale combined input

Fig. 25

METHODS AND SYSTEMS FOR EVENT-DRIVEN RECURSIVE CONTINUOUS-TIME DIGITAL SIGNAL PROCESSING

CROSS-REFERENCE TO RELATED PATENT APPLICATIONS

This application claims priority to and the benefit under 35 U.S.C. § 119(e) of U.S. Provisional Patent Application No. 62/376,112, filed Aug. 17, 2016 and titled "An Event-Driven Recursive Continuous-Time Digital Signal Processor," the contents of which are hereby incorporated by reference in their entirety.

FIELD OF THE DISCLOSURE

The present application disclosure relates to methods and systems for continuous-time digital signal processing. More particularly, the present application relates to methods and systems for event-driven recursive continuous-time digital processing.

BACKGROUND

Prior art continuous-time digital signal processing (CT-DSP) systems have shown that digital signals processed in continuous time are free of alias and thus have a superior spectral feature. The power consumption of CT-DSP systems is event-driven; event-driven power consumption is more efficient than power consumption of conventional discrete-time DSP systems. Despite the power consumption benefits, prior art filters, for example, transversal filters, have been implemented with a limited order, for example, maximum order is $16^{th}$. One possible explanation is that high-order transversal filters request a large number of delay blocks, which consume a large amount of power and chip area. Accordingly, a need exists for efficient high-order filters that are area- and energy-efficient.

SUMMARY

According to aspects of the disclosure, a continuous-time digital signal processor (CT DSP) is provided. The CT DSP can include an event-grouping block, configured to receive a first input timing signal, a second input timing signal, and to generate an intermediate timing signal, a first time delay block, configured to receive the intermediate timing signal and generate an output timing signal, and a second time delay block, configured to receive the output timing signal and generate the second input timing signal.

The CT DSP can also include a two-channel memory configured to receive a first data input and a second data input and to generate a first intermediate data signal and a second intermediate data signal, an arithmetic operation block, configured to receive the first intermediate data signal, the second intermediate data signal and to generate an output data signal, and a first-in-first-out (FIFO) memory configured to receive the output data signal and to generate the second input data signal. The arithmetic operation block can include a scalar block configured to receive the second intermediate data signal and generate a scaled version of the second intermediate data signal and an adder configured to receive the first intermediate data signal and the scaled version of the second intermediate data signal, and generate the output data signal.

According to aspects of the disclosure, a method for continuous-time digital signal processing, is provided. The method can include the steps of, by an event-grouping block, receiving a first input timing signal, a second input timing signal, and generating an intermediate timing signal, by a first time delay block, receiving the intermediate timing signal and generating an output timing signal, by a second time delay block, receiving the output timing signal and generating the second input timing signal, by a two-channel memory, receiving a first data input and a second data input and generating a first intermediate data signal and a second intermediate data signal. The method can also include the steps of, by an arithmetic operation block, receiving the first intermediate data signal, the second intermediate data signal and generating an output data signal, by a scalar block, receiving the second intermediate data signal and generating a scaled version of the second intermediate data signal, by an adder, receiving the first intermediate data signal and the scaled version of the second intermediate data signal, and generating the output data signal, and by a first-in-first-out (FIFO) memory, receiving the output data signal and generating the second input data signal.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 5 shows exemplary operations in an event-detection block, according to aspects of the disclosure.

FIG. 6A shows an exemplary first-order IIR filter, according to aspects of the disclosure.

FIG. 6B shows exemplary timing of the signals in the first-order IIR filter of FIG. 6A, according to aspects of the disclosure.

FIG. 7A shows exemplary timing and data paths of a first-order IIR filter, according to aspects of the disclosure.

FIG. 7B shows exemplary timing of the operations in the timing path of FIG. 7A, according to aspects of the disclosure.

FIGS. 8A-B show exemplary block diagrams of a first order IIR filter, according to aspects of the disclosure.

FIGS. 9A-B show exemplary block diagrams of a second order IIR filter, according to aspects of the disclosure.

FIG. 11 shows an exemplary block diagram of a first order continuous-time III filter, according to aspects of the disclosure.

FIG. 12 shows an exemplary timing diagram of a filter operation, according to aspects of the disclosure.

FIG. 13 shows an exemplary timing diagram of a filter operation, according to aspects of the disclosure.

FIG. 25 shows a die photo of an exemplary filter implementation and a comparison with prior art filters, according to aspects of the disclosure.

DETAILED DESCRIPTION

The disclosed systems and methods use a fixed number of delay lines to implement filters of any order. The disclosed systems and methods reduce the area and power consumption of prior art filter implementations. The disclosed systems and methods implement recursive continuous-time digital signal processors, for example, infinite-impulse response (IIR) filters, which can be more efficient than finite-impulse response (FIR) filters.

Delay-based continuous-time digital systems can be used in digital signal processing, control systems, and computation systems. Because of their event-driven feature, they can dissipate power much more efficiently than conventional discrete-time systems. However, if a delay-based continuous-time digital system is used in a feedback loop, its event-driven feature cannot be sustained. More specifically, if one event enters a continuous-time system with a feedback loop, it will generate a new event every time it goes through the loop and thus create an infinite number of events without a stop. According to embodiments, the disclosed systems and methods implement delay-based continuous-time digital systems with feedback loops that allow the feedback loop to break when the signals of the system do not change. The feedback loop can be formed again, as soon as a data change is detected. Thus, the disclosed systems and methods can maintain the event-driven feature of continuous-time digital systems even with feedback loops.

An event-driven delay-based continuous-time digital feedback system

Figure 1:
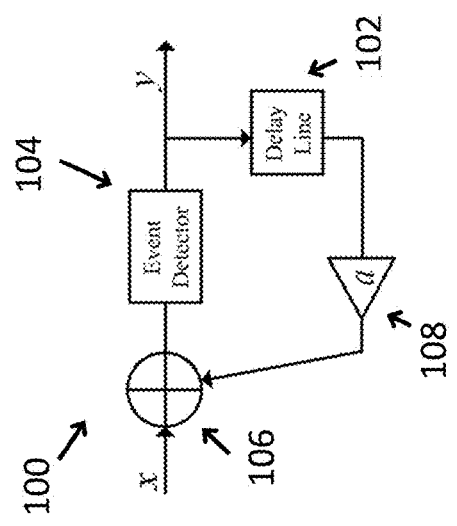
FIG. 1 shows an exemplary implementation of an event-driven delay-based continuous-time digital feedback system, according to aspects of the disclosure.

According to aspects of the disclosure, an event-driven delay-based continuous-time digital feedback system can take a continuous-time digital signal as input and can generate one or more continuous-time digital signals as output. An event-driven delay-based continuous-time digital feedback system can include continuous-time delay lines, signal processing blocks, and event detecting blocks. FIG. 1 shows an exemplary implementation of an event-driven delay-based continuous-time digital feedback system 100. It has one continuous-time digital input, x, one continuous-time digital output, y, one delay line 102, one signal processing block, and one event-detection block 104. The signal processing block can include an adder 106 and a multiplier 108.

Figure 2:
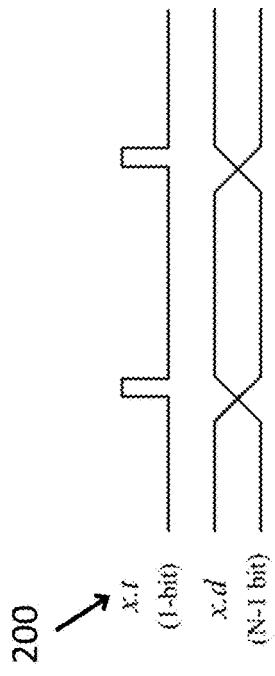
FIG. 2 shows an exemplary illustration of bundled data, according to aspects of the disclosure.

A continuous-time digital signal can be represented as an N-bit digital data, with N−1 bits representing its magnitude, while the other bit representing the time instants when a new data is generated. This format is often called bundled data. FIG. 2 shows an example of a bundled data x (200). The timing information, which is referred to as x.t, contains pulses. Each pulse indicates a new data or equivalently a new event. For a bundled data coming directly out from a level-crossing analog-to-digital converter (ADC), a new event is always associated with a change in the magnitude of the bundled data, which is referred to as x.d. However, this is not necessarily true in the internal signals within a large system, for example in a continuous-time DSP or a continuous-time digital controller. That is, a new event can happen, without a corresponding change in the magnitude. For example, if two inputs of an adder have a new event simultaneously, with one's magnitude increasing by 1, while the other's magnitude decreasing by 1, the magnitude of the output will not change. However, the output of the adder is still considered to have a new event, because it corresponds to events at the adder inputs. Accordingly, a pulse has to be generated to be associated with this new event.

Figure 3:
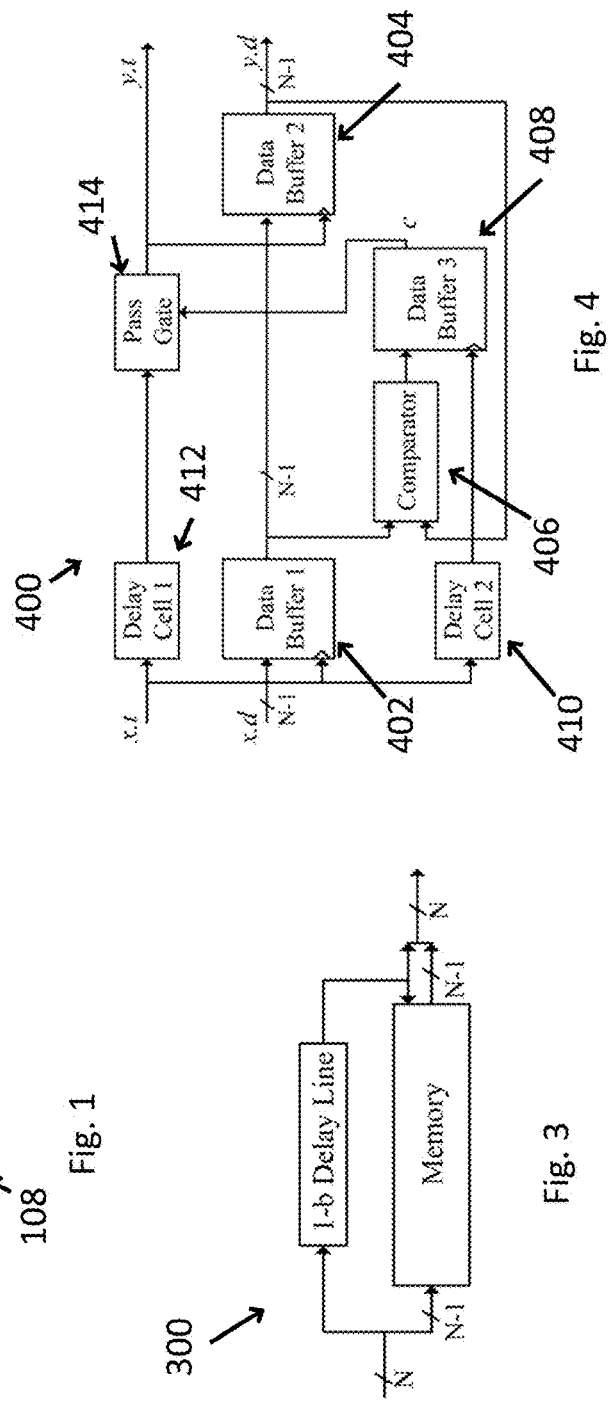
FIG. 3 shows an exemplary implementation of a continuous-time digital delay line, according to aspects of the disclosure.

A continuous-time digital delay line block involves a single-bit (1-b) delay line to delay the timing signal of a bundled data and a first-in-first-out-type (FIFO) memory to temporary store the magnitude information. FIG. 3 shows an exemplary implementation of a continuous-time digital delay line 300. An N-bit bundle data is split into two parts at the input of the delay line. The timing bit goes into the 1-bit delay line and the magnitude bits (N−1) go into the memory. When a pulse arrives at the timing bit in the input, the magnitude is saved into the memory and the delay line is triggered, and can propagate at the delay line. After a specific amount of delay, defined by the 1-b delay line, the pulse arrives at the output of the delay line and triggers the memory to output the oldest data stored in the memory. When the oldest data is output from the memory, the timing bit and the magnitude bits can be combined to represented the complete output data. Effectively, the entire block delays the complete bundled data by an amount which is defined in the 1-b delay line.

The 1-b delay line can introduce a predetermined delay to the 1-bit timing signal. According to aspects of the disclosure, the delay line can include multiple delay stages, the delay implemented by each of which must be smaller than the minimum timing distance between any two successive events in the system. This minimum timing distance refers to the granularity of the delay line.

Figure 4:
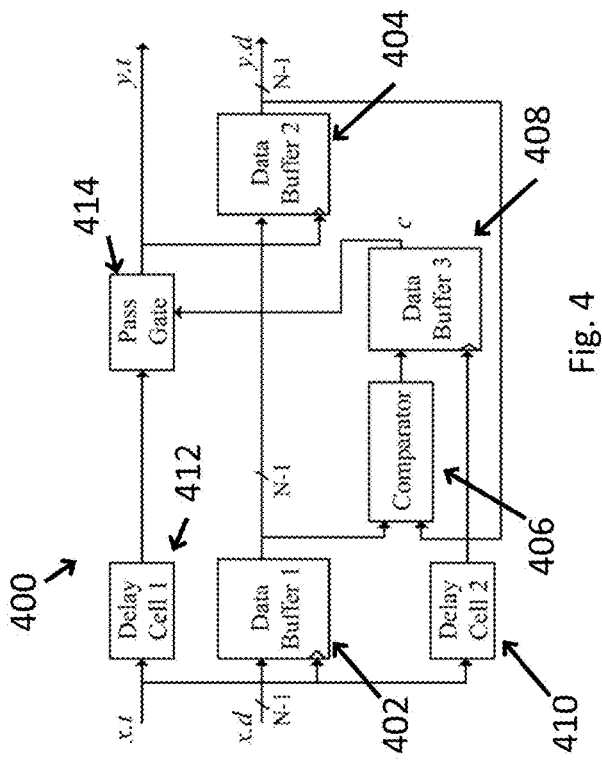
FIG. 4 shows an exemplary implementation of an event-detection block, according to aspects of the disclosure.

An event-detection block receives a continuous-time digital signal as input and generates a continuous-time digital signal as output. According to aspects of the disclosure, whenever a new event arrives at the event-detection block, the event-detection block compares the magnitude information of the bundled data corresponding to the new event with the magnitude information of the previous event. If the two are the same, the new event is blocked by the event-detection block and thus will not propagate to the output. Since the new bundled data has the same magnitude information as the previous bundled data, eliminating the new event will not result in loss of information. If the comparison result indicates that the magnitude information of the bundled data corresponding to the new event is different from the magnitude information of the bundled data corresponding to the previous event, the new data propagates through the event-detection block to the output. FIG. 4 shows an exemplary implementation of an event-detection block 400. It can include delay cells, data buffers, a comparator, and a pass gate. The data buffers can be sequential elements. When a data buffer receives a positive edge at a timing input, for example the input port illustrated with a triangular symbol, the data buffer updates its output data to match the input data. Absent a positive edge at the timing input, the output of the data buffer will not change.

The two data buffers of the event-detection block of FIG. 4 can store the magnitude of the current bundled data and the magnitude of the previous bundled data. If, for example, new bundled data arrives at the input of the event-detection block, x, corresponding to the combination of x.t and x.d, the event-detection block can store the new data into data buffer 1 (402). The event-detection block can compare the magnitude of the new data with the magnitude of the previous data—corresponding to the output of the event-detection block—y.d, through the comparator 406. It they are the same, the comparator outputs a logic one "1." Otherwise, the comparator outputs a logic zero "0." A delayed signal x.t can be used as the timing input of data buffer 3 (408). Once a pulse arrives at the timing input of data buffer 3 (408), the comparison result can reflected at its output "c." A timing constraint requires that the delay implemented by delay cell 2 (410) is shorter than the delay implemented by delay cell 1 (412), such that when the pulse of "x.f" arrives at the output of delay cell 1 (412), the pass gate 414 has received the output "c" of data buffer 3 (408). If c=1, the pulse from delay cell 1 (412) at the input of the pass gate 414 does not propagate through the pass gate. Otherwise, the pulse from delay cell 1 (412) propagates through the pass gate and is received at the input of data buffer 2 (404). When this pulse is arrived, the new data can be stored into data buffer 2 (404). This process makes the "new" data become the "previous" data, with which the next data will be compared. FIG. 5 shows an illustrative example of the operations in the event detection block. When the first event in "x" arrives, it propagates through the pass gate because it has different a magnitude information "D1" compared to the previous data "D0." Once it propagates, a pulse arrives at the output "y.t." and the magnitude stored in y.d. becomes "D1." When a second event in "x" arrives, it is blocked, because the magnitude information corresponding to the second event is the same as the magnitude information of the first event. As a result, there is no new pulse generated at y.t.

Recursive CT DSP

FIG. 6A shows an exemplary first-order CT IIR filter 600. The filter output corresponds to the sum of the filter input signal and a delayed and scaled version of the filter output signal. Without a clock signal, the operations of the CT IIR filter can be triggered by the first event at the input "x." FIG. 6B shows a timing diagram (650) where the first pulse in "x" triggers the adder at an arbitrary time instant. For simplicity, only the timing information is shown in the plot to indicate events. Assuming an adder with zero-delay, the pulse simultaneously triggers the operation of the delay line. After a delay of "$T_D$," the pulse arrives at the output of the delay line, "y'." Assuming the scalar block ("$b_1$") is zero-delay, y' triggers a new operation at the adder. This procedure repeats every "$T_D$" with a new event generated at the output "y" of the IIR filter in each cycle. The time-domain equation describing this filter is shown below:

$$y(t)=x(t)+b(t-T_D) \qquad (1)$$

Applying Laplace transform on both sides, the transfer function of the system is shown below:

$$H(s) = \frac{1}{1 - b_1 e^{-sT_D}} \qquad (2)$$

The loop gain of this system is $b_1 e^{-sT_D}$. According to aspects of the disclosure, the value of the "$b_1$" multiplier is selected to provide a stable system.

The timing and the data paths of the system in FIG. 6A are separated and form a new set of diagrams 700 shown in FIG. 7A. Shown on the left of FIG. 7A is the timing path (702) of the first-order IIR filter of FIG. 6A. Both x.t and y'.t are the inputs of a merging block, labelled as "M". Whenever there is a pulse in either x.t. or y'.t, the merging block outputs a pulse. Thus, it acts as a logical "OR" for the timing signals. For illustrative purposes, merging block "M" is assumed to be zero-delay. FIG. 7B shows a timing diagram (750) of the operations in the timing path. When the first pulse in x.t arrives at the merging block, it triggers a pulse in y.t. After a $T_D$ delay, the pulse in y.t arrives in y'.t. As a result, it triggers a new pulse in y.t. through the merging block. This process repeats every $T_D$. A person of skill would understand that the behavior of the pulses in x.t, y.t and y'.t are identical to the pulses of the filter of FIG. 6B.

The right part of FIG. 7A shows the data path (704) of the filter, with y.d equal to the sum of x.d and $b_1$*y'.d; y.d and y'.d correspond to the input and the output of a first-in-first-out-type (FIFO) memory respectively. The propagations of the data signals are controlled by their corresponding timing signals. More specifically, x.d is controlled by x.t. When there is a pulse in x.t, it triggers the adder to take the new data in x.d and to calculate a new output on y.d. y.d is controlled by y.t. When there is a pulse in y.t, the memory stores the data y.d. Signal y'.d is controlled by y'.t. When there is a pulse in y.t, the memory reads out the oldest stored data, and outputs it on y'.d, which triggers operations in the scalar block and the adder block. For illustrative purposes, the calculating, storing, and reading operations are zero-delay. When the memory is empty and a pulse arrives at y.t., the data on y.d move into the memory. After a delay corresponding to $T_D$, the pulse arrives at y'.t. The memory reads out data and outputs it on y'.d. It must be the only data which is stored in $T_D$ ago. Thus, under the control of y.t and y'.t, the memory implements a delay of $T_D$. The time-domain equation of the data path can be written as:

$$y.d(t)=x.d(t)+b_1*y.d(t-T_D) \quad (3)$$

The transfer function of the data path is the same as the transfer function of equation (2).

The implementation of a first order IIR filter with an added zero requires two more scalar blocks and one more adder block. FIG. 8A shows a first-order IIR filter implemented in direct form II (800). The transfer function of the IIR filter is:

$$H(s) = \frac{a_0 + a_1 e^{-sT_D}}{1 - b_1 e^{-sT_D}} \quad (4)$$

For illustrative purposes, the scalar blocks and the adder blocks are assumed to have zero delay. In this case, the timing information of y and $y_1$ are the same. Whenever there is a new event in $y_1$, adder 802 is triggered and generates a new event in y, simultaneously with the new event in $y_1$. Therefore, in a zero-delay system of FIG. 8A, a pulse in $y_1$ corresponds to a pulse in y.

With the above observation in mind, the timing and the data paths of the filter 800 can be separated, resulting in the new diagram in FIG. 8B. Since signals $y_1$ and y have the same timing information, one signal, $y_1$.t, can be used to control both data nodes $y_1$.d and y.d. However, $y_1$.d and y.d cannot be merged because they can contain different data information. As a result, the pulses in $y_1$.t can have multiple meanings. When a pulse arrives at $y_1$.t, this means that a new event is generated in $y_1$.d. This event triggers the scalar $a_0$ and adder 852. The event also triggers the memory to store the new data. Similarly, when the pulse arrives at $y_1$.t, this means that a new event is also generated in y.d.

A second-order filter can be implemented by cascading two first-order IIR filters. FIG. 9A shows an exemplary implementation 900, where two first-order IIR in direct form II are cascaded. For simplicity, the feed-forward part of the second section is omitted. The time domain equations of the second-order filter are:

$$y(t)=a_0 y_1(t)+a_1 y_1'(t)+c_1 y'(t)$$

$$y_1(t)=x(t)+b_1 y_1'(t)$$

$$y_1'(t)=y_1(t-T_D)$$

$$y'(t)=y(t-T_D) \quad (5)$$

And the transfer function of the filter is:

$$H(s) = \frac{a_0 + a_1 e^{-sT_D}}{(1 - b_1 e^{-sT_D})(1 - c_1 e^{-sT_D})} \quad (6)$$

Because the scalar blocks and the adder blocks have zero delay, y and $y_1$ in FIG. 9A will have the same timing information. In addition, since the delay lines in the two sections are the same as $T_D$, the timing information of $y_1'$ and y' are also the same. This means that the pulses in $y_1$ and y, $y_1'$ and y' always occur at the same time, but the pulses between these two pairs need not be the same. Therefore, the timing and the data paths of this filter can be separated, as shown in the new block diagram (950) in FIG. 9B. As shown, $y_1$.t controls the timings of two data nodes $y_1$.d and y.d. A pulses at $y_1$.t corresponds to a new event in $y_1$.d and a new event in y.d. The former triggers the scalar block $a_0$ and Memory 1, while the latter triggers Memory 2. Similarly, $y_1'$.t controls both $y_1'$.d and y'.d and hence a pulse at $y_1'$.t corresponds to a new event in $y_1'$.d and a new event in y'.d. The former triggers the scalar blocks $b_1$ and $a_1$, while the latter triggers the scalar block $c_1$. Since both memory blocks with their timing control signals implement a delay of $T_D$, the time-domain equations of the filter are:

$$y.d(t)=a_0 y_1.d(t)+a_1 y_1'.d(t)+c_1 y'.d(t)$$

$$y_1.d(t)=x.d(t)+b_1 y_1'.d(t)$$

$$y_1'.d(t)=y_1.d(t-T_D)$$

$$y'.d(t)=y.d(t-T_D)$$

The transfer function of the system is:

$$\frac{Y.D(s)}{X.D(s)} = \frac{a_0 + a_1 e^{-sT_D}}{(1 - b_1 e^{-sT_D})(1 - c_1 e^{-sT_D})} \quad (7)$$

The transfer function of the system is the same as the transfer function of equation (6).

As illustrated in the examples of the first-order IIR, the first-order IIR with a zero, and the second-order IIR, the timing paths are the same. The feed-forward and feedback paths can be cascaded continuously to include more poles and zeros, while the timing path can be the same. Therefore, a person of skill in the art, would understand that, only one delay line can be used in the timing path to implement a filter of any order. In prior art implementations of CT DSPs, the number of delay lines increases proportionally with the order of the filter, which results in increased area and power consumption. As illustrated in the disclosed methods and systems, separating the timing and data paths, decouples the number of delay lines from the filter order, which can save power and result in reduced area for implementations of high-order CT DSPs.

In discrete-time DSPs (DT DSPs), all the signals are pre-known to propagate at a same pace, and, therefore, their timing signals can be merged into one global clock. In CT DSPs on the other hand, all the signals can propagate at different paces. All the timing signals that are the same can be merged, and those that cannot be merged in the timing path are implemented separately.

Figure 10A:
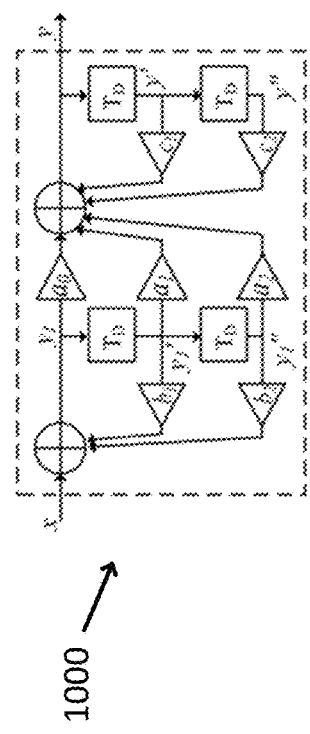
FIGS. 10A-B show exemplary block diagrams of a fourth order IIR filter, according to aspects of the disclosure.

Although by cascading first-order sections one can implement a filter with any order, the poles and zeros of the filter are all real. However, filters with complex poles can realize a high-quality factor. Accordingly, a filter can contain second-order sections to realize a high-quality factor. FIG. 10A shows a block diagram 1000 of a fourth-order filter composed of two second-order sections. The transfer function of the filter shown in FIG. 10A is:

$$\frac{Y.D(s)}{X.D(s)} = \frac{a_0 + a_1 e^{-sT_D} + a_2 e^{-2sT_D}}{(1 - b_1 e^{-sT_D} - b_2 e^{-2sT_D})(1 - c_1 e^{-sT_D} - c_2 e^{-2sT_D})} \quad (7)$$

Figure 10B:
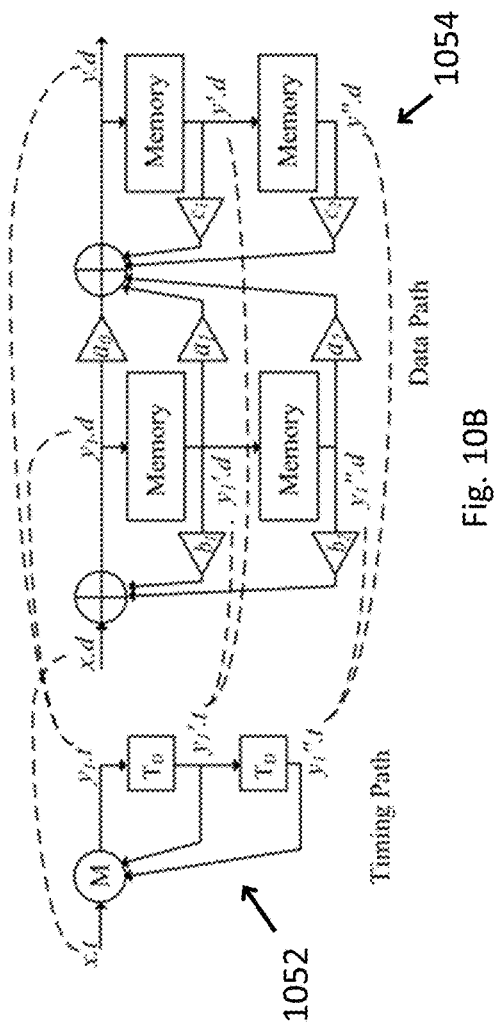

Because all the scalar and adder blocks are assumed to be delay free, for illustrative purposes, the timing information in $y_1$ and y are always the same, e.g., there is no propagation delay for a signal through a scalar block and an adder block. Because all the delay blocks have the same length of delay, $T_D$, the timing information of $y_1'$ and y', $y_1''$ and y'' are also the same, but the timing between these two pairs need not be the same. Hence, one common signal can be used to control each individual pair of these nodes. This is illustrated in the block diagram shown in FIG. 10B. In the timing path 1052, a new delay line is added to create a new timing signal $y_1''.t$. This signal corresponds to signal $y_1.t$ delayed by $2T_D$. The three timing signals, $y_1.t$, $y_1'.t$, $y_1''.t$, control three groups of nodes in the data path 1054. Signal $y_1.t$ controls $y_1.d$ and $y.d$; signal $y_1'.t$ controls $y_1'.d$, and signal $y'd$; $y_1''.t$ controls $y_1''.d$ and $y''.d$. The nodes within each group are on the same horizontal level in the diagram 1050. If more sections were cascaded to implement a high order filter, the data path block diagram would expand horizontally to include more adder blocks, scalar blocks and memories. However, the timing path would remain the same for each level. All the nodes on the same horizontal level in the data path would be controlled by the same timing signal.

Recursive CT DSP with Propagation Delays

The disclosure so far has assumed that the adder and scalar blocks have zero propagation delay. In practice, they are implemented by combinational logic gates and thus have non-zero propagation delays. In addition, an adder typically cannot process two input events arriving arbitrarily close. These limitations are considered below for an event-grouping solution, according to aspects of the disclosure.

FIG. 11 shows a block diagram 1100 of a modified first-order CT IIR filter, taking into account the propagation delay. The filter of FIG. 11 can also handle an arbitrary traffic condition at the adder. In the data path 1104, the scalar block $b_1$ and the adder block have been moved into a single arithmetic block 1106, with $T_A$ corresponding to the worst case propagation delay through block 1106. According to alternative embodiments, another scalar block can be placed before the first input of the adder block. Systems with multiple different arithmetic blocks are discussed below, with $T_A$ corresponding to the worst case propagation delay among the different arithmetic blocks. A two-channel memory 1108 can be inserted in front of the arithmetic block 1106. When a pulse arrives at one of the inputs of the two-channel memory 1108, the data on the corresponding channel is stored into the memory and when a pulse arrives at one of the outputs of the two-channel memory, the data on the corresponding channel is read out.

In the timing path 1102, the original timing-merging block (labelled as "M") is replaced by an event-grouping block 1110 (labelled as "G"), which takes both x.t and y'.t as inputs. The event-grouping block 1110 facilitates handling of an arbitrary input traffic condition. When a pulse arrives at either x.t or y.t', it is not responded by the grouping block 1110 immediately. Instead, the arrival of the pulse triggers a timing window in the grouping block 1110, the length of which is equal to $T_A$. According to aspects of the disclosure, the grouping block generates a pulse at its output $y_G.t$ at the end of the grouping window. Any pulses arriving within a grouping window will not trigger a new grouping window.

The controlling relations between the timing signals and the data path nodes are the following: signal x.t controls x.d; signal y'.t controls y'.d; signal $y_G.t$ controls both outputs of the buffer 1108. Combining both the timing and the data paths, the complete operations of the filter are shown, an example of which is shown in the timing diagram 1200 of FIG. 12. Initially, the first pulse arrives at x.t. It triggers the grouping block in the timing path 1102 to generate a grouping window. It can also trigger memory 1108 in the data path to store the data of x.d. At the end of the grouping window, a pulse is generated at the output of the grouping block $y_G.t$. The pulse can trigger reading out data from both channels of memory 1108 and send the data into the arithmetic block 1106. After a $T_A$ delay, a pulse is generated at y.t. The $T_A$ delay models the delay of the arithmetic block 1106. The pulse in y.t indicates that a new data has just been calculated by the arithmetic block and triggers the memory 1114 to store the data arriving at y.d. Because the nominal delays of the grouping block and the arithmetic block are $T_A$, memory has to implement a delay of $T_D-2T_A$ to assure that the total delay of the loop is still $T_D$. Accordingly, the distance between y.t and y'.t in the timing path 1102 is $T_D-2T_A$ (1112). After going through the delay line 1112, a pulse arrives at y'.t. If a second pulse arrives at x.t slightly before the pulse on y'.t, when the pulse arrives at y'.t, it doesn't trigger a new grouping window. However, it reads out a new data from memory 1114 and stores it in memory 1108 in the data path 1104. At the end of the grouping window, the second pulse is generated in $y_G.t$. It reads both data out from memory 1108 and send them into the arithmetic block 1106. According to aspects of the disclosure, grouping is performed because due to the delay in the arithmetic block, two events within a timing distance shorter than $T_A$ cannot be processed. These events are grouped manually and processed both at once.

In FIG. 12, because the first pulse in y'.t arrives within an existing grouping window, the delay from y'.t to $y_G.t$ is shorter than $T_A$. Since it is part of the feedback loop in the timing path, it can cause the loop delay to be shorter than $T_D$. The exact delay value depends on the relative timing distance between the events in x.t and y'.t. This creates an input-dependent loop delay. The input-dependent loop delay may not be a problem in first-order systems, because they are unconditionally stable. However, as the order of the system increases, a data-dependent loop delay can cause instability. Hence, the loop delay should be addressed.

According to aspects of the disclosure, the grouping window can be extendable to the input y'.t. More specifically, if a pulse in y'.t arrives within an existing grouping window, the existing grouping window can be extended by a new $T_A$. Thus, independent on when a pulse in y'.t arrives at the grouping block, the grouping window always closes $T_A$ after the pulse arrives. This will result in a fixed-loop delay. Note that the pulses in x (the feed-forward path) are not allowed to extend an existing window. FIG. 13 shows a timing diagram 1300 illustrating the extendable grouping method.

As illustrated in FIG. 13, the windowing method does not affect the operations in the first grouping window since upon the time when the first pulse in x.t arrives, no grouping window has commenced yet. The difference occurs when the first pulse in y'.t arrives, because there is already a grouping window 1302. The pulse in y'.t extends the window by $T_A$. A pulse is generated at $y_G.t$ at the end of the extended window. Thus, the delay from y'.t to $y_G.t$ is always $T_A$ and the entire loop delay is maintained fixed as $T_D$. This method causes the delay from x.t to $y_G.t$ to become data dependent. This variable delay in the feed-forward path is more tolerable than having variable delay in the feedback path. A variable delay in the feed-forward path does not affect the stability of a system. It may add a small timing error in the input signals.

The time-domain equations of the filter illustrated in FIG. 11 are:

$$y.d(t)=x.d(t-2T_A)+b_1 y'.d(t-2T_A)$$

$$y'.d(t)=y.d(t-T_D+2T_A)$$

The transfer function of the system is thus:

$$H(s) = \frac{e^{-s2T_A}}{1 - b_1 e^{-sT_D}} \quad (8)$$

Compared to equation (2), the implementation that takes into account propagation delays introduces a $2T_A$ delay, which does not affect the magnitude response.

Figure 14:
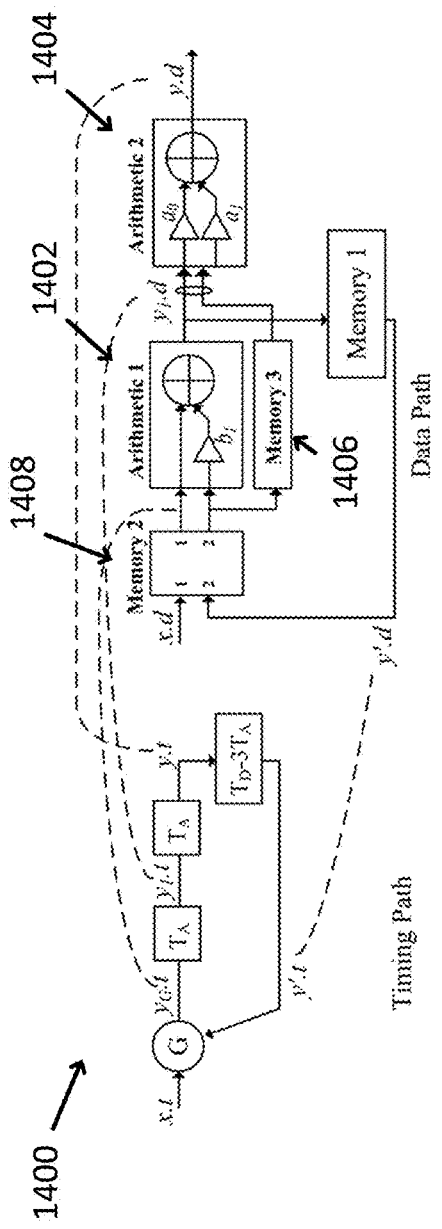
FIG. 14 shows an exemplary block diagram of a first order continuous-time III filter, according to aspects of the disclosure.

FIG. 14 shows a modified block diagram of a first-order IIR filter with a zero. The arithmetic block 1404 is included to create a zero for the filter. The inputs of arithmetic block 1402 are the output and one of the inputs of arithmetic block 1402. However, because of the $T_A$ delay in arithmetic block 1402, the two signals always have a timing distance of $T_A$. Memory 1406 is added in parallel with arithmetic 1. The timing of its input and output are controlled by $y_G$.t and $y_1$.t respectively. Because $y_G$.t and $y_1$.t sandwich a $T_A$ delay in the timing path, the data at the output of memory 1406 is always a $T_A$-delayed version of its input. Therefore, memory 1406 aligns the two inputs of arithmetic 1404 in the time domain. Another timing signal y.t is tapped out from the timing path. It is a $T_A$-delayed version of $y_1$.t and controls y.d in the data path. A pulse on y.t means a new data has just been calculated by arithmetic block 1404.

Notice that although one more signal is tapped out from the timing path, the entire loop delay is still $T_D$ and thus no hardware overhead is added in the delay line. Since $T_D$ is usually much larger than $T_A$, $T_D-3T_A$ is larger than zero and, therefore, can be implemented in hardware.

The time-domain equations of the filter shown in FIG. 14 are shown below:

$$y.d(t)=a_0y_1.d(t-T_A)+a_1y'.d(t-3T_A)$$

$$y_1.d(t)=x.d(t-2T_A)+b_1y'.d(t-2T_A)$$

$$y'.d(t)=y.d(t-T_D+3T_A)$$

The transfer function of the filter is:

$$H(s) = \frac{e^{-s3T_A}}{1 - b_1 e^{-sT_D}} \quad (9)$$

A person of skill would understand there is a $3T_A$ delay in the feed-forward path due to the memory 1408, and arithmetic blocks 1402/1404.

Figure 15:
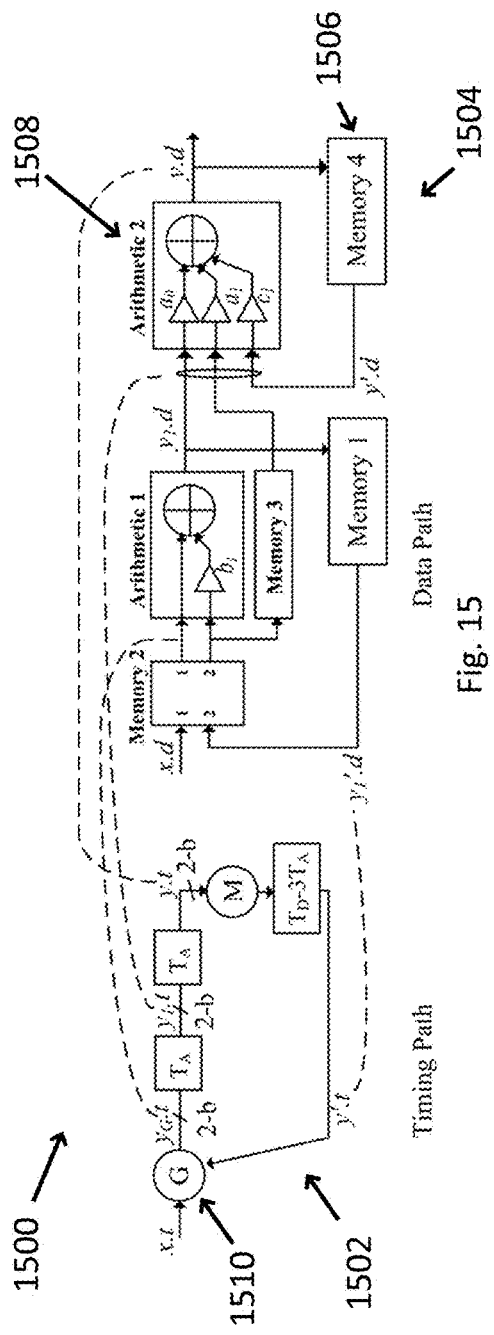
FIG. 15 shows an exemplary block diagram of a second order continuous-time III filter, according to aspects of the disclosure.

FIG. 15 shows the block diagram 1500 of an exemplary second-order CT IIR filter, where two first-order filters have been cascaded. In the data path 1504, a feedback loop from y.d to y'.d to y.d is added, compared to the implementation shown in FIG. 14. The feedback look includes memory 1506 and scalar block ci. The output of memory 1506, y'.d, is one of the three inputs of arithmetic block 1508. According to aspects of the disclosure, because there is no grouping block in front of arithmetic block 1508, one timing signal ($y_1$.t) is used to control the three inputs, e.g., these inputs are aligned by using one timing signal to control them. When there is a pulse at $y_1$.t, the data on all three inputs are presented to arithmetic block 1508 for a new calculation. Timing signal y.t controls the input of memory 1506 (y.d); signal $y_1$.t controls y'.d. In the timing path 1502, y.t and $y_1$.t are spaced by $T_D-T_A$. Thus, memory 1506 implements a delay of $T_D-T_A$. Since arithmetic block 1508 has an additional delay $T_A$, the entire loop delay of the second feedback loop is also $T_D$.

In the timing path 1502, because y.t and $y_1$.t are in a loop, it is not clear which one comes first. For example, it is both right to say that $y_1$.t lags y.t by $T_D-T_A$ and $y_1$.t leads y.t by $T_A$. However, these two expressions are not the same. Since $y_1$.t and y.t control the input and output of memory 1506 respectively, a $T_D-T_A$ lag means an output is read out $T_D-T_A$ after it is stored. Hence, memory 1506 implements a delay of $T_D-T_A$. However a $T_A$ lead means that an output is read out even before a data is stored. In that case, the data on y'.d are not correct. The system should distinguish between the two. Signal $y_1$.t leading signal y.t happens when the pulse is coming from x.t. Starting from x.t in the timing path 1502, the pulse goes through the grouping block and a $T_A$ delay to $y_1$.t and then arrives at y.t. Within this period of time, no pulse occurs in the feedback path and thus the system should not read memory 1506. On the other hand, signal $y_1$.t lagging signal y.t happens when the pulse is coming from the feedback path. Starting from y.t in the timing path 1502, the pulse goes through $T_D-3T_A$ to y'.t, and then through the grouping block 1510 and $T_A$ delay block to $y_1$.t. Within this period, a data is stored into memory 1506 first and then is read out $T_D-T_A$ later. This corresponds to a proper operation. Grouping block 1510 in the timing path 1502 can distinguish the two cases. Triggering by two different inputs, a 2-b output $y_G$.t can store this information. If a window only contains feed-forward pulses from x.t, a pulse on $y_G$.t.0 can be generated at the end of the window. If a window contains a feedback pulse from y'.t, independent of whether it contains a feed-forward pulse or not, a pulse on $y_G$.t.1 will be generated at the end of the window. The pulses on $y_G$.t.0 and $y_G$.t.1 are mutual exclusive. When a pulse propagates from $y_G$.t.0 to $y_1$.t.0, it triggers arithmetic block 1508 without reading a new data out from memory 1506. When a pulse propagates from $y_G$.t1 to $y_1$.t1, the pulse reads out a data from memory 1506 and triggers arithmetic block 1508. Once the 2-b signal passes y.t, they can be merged into a 1-b signal through a merger. Because the pulses on these two bits are always mutual exclusive, the merger can be simply an OR gate. The time-domain equations of the filter shown in FIG. 15 are:

$$y.d(t)=a_0y_1.d(t-T_A)+a_1y_1'.d(t-2T_A)+c_1y'.d(t-T_A)$$

$$y_1.d(t)=x.d(t-2T_A)+b_1y_1'.d(t-2T_A)$$

$$y_1'.d(t)=y_1.d(t-T_D+2T_A)$$

$$y'.d(t)=y.d(t-T_D+T_A)$$

The transfer function of the filter is:

$$\frac{Y.D(s)}{X.D(s)} = \frac{a_0 + a_1 e^{-sT_D}}{(1-b_1 e^{-sT_D})(1-c_1 e^{-sT_D})} e^{-3sT_A} \quad (10)$$

By cascading more feed-forward and feedback stages, high-order CT IIR filters can be implemented. Although the numbers of the arithmetic and memory blocks in the data path are linearly increasing as more stages cascade, the structure of the timing path doesn't change. It will always be the one in FIG. 15. More timing signals may be required to be tapped out from the timing path 1502, but there is not additional hardware overhead.

Figure 16:
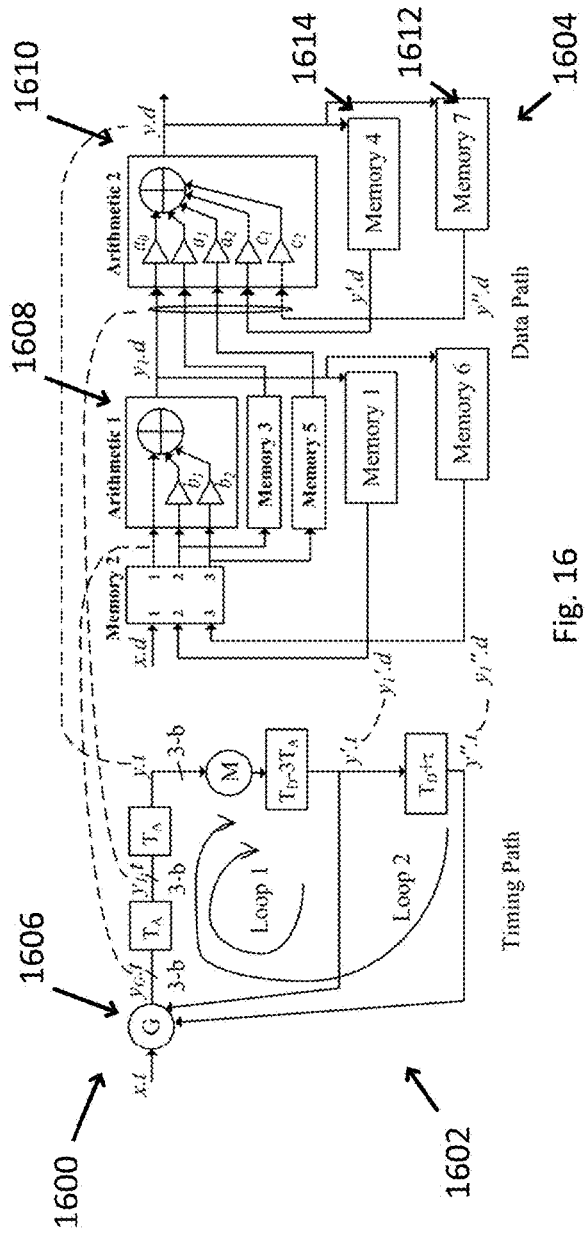
FIG. 16 shows an exemplary block diagram of a fourth order continuous-time III filter, according to aspects of the disclosure.

FIG. 16 shows modified block diagrams of an exemplary fourth-order IIR filter with two second-order sections. In the timing path 1602, a feedback loop is added which contains a new delay line. Thus, the timing path 1602 there are two loops. Loop 1 is defined from y'.t→$y_G$.t→$y_1$.t→y.t→y'.t;

loop 2 is defined from y'.t→y".t→$y_G$.t→$y_1$.t→y.t→y.'t. In a second-order section, the delay of loop 2 is twice the delay of loop 1. Otherwise, the system can become unstable. If the delay in loop 1 is $T_D$, the delay line in loop 2 needs to be equal to $T_D$, such that the total delay of loop 2 is $2T_D$. This is hard, if not impossible to achieve in a hardware implementation. Any mismatch in the hardware implementation can cause the delay to be different from the ideal delay $T_D$. Hardware implementation most likely would deviate from this ideal value, for example, the actual delay can be $T_D+\tau$.

Figure 17:
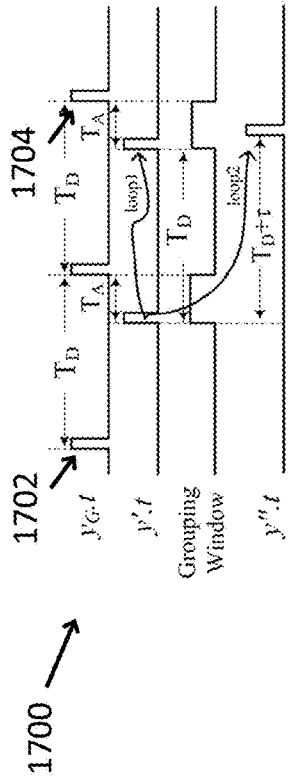
FIG. 17 shows an exemplary timing diagram of a filter operation, according to aspects of the disclosure.

According to aspects of the disclosure, the grouping block 1606 can address the mismatch in the delay lines between the two loops, as explained in connection with the timing diagram 1700 of FIG. 17. As shown in the timing diagram, a pulse 1702 arrives at $y_G$.t. FIG. 17 also shows that the pulse arrives at y'.t after $T_D-T_A$. The pulse in y'.t can propagate through two different paths. One triggers grouping window and goes through loop 1 again. It arrives at y'.t again after $T_D$ and triggers another grouping window. The other goes through the delay line in loop 2. It arrives at y".t after $T_D+\tau$. As evidenced in the timing diagram, as long as the pulse in y".t arrives within the grouping window, only one pulse 1704 in $y_G$.t will be generated at the end of that window. The pulse in $y_G$.t is $2T_D$ away from the initial pulse and thus the effective delay in loop 2 is $2T_D$. A person of skill would understand that, as long as $0<\xi<T_A$, the grouping block can absorb the delay mismatch by aligning the pulses on y'.t and y".t at the end of grouping windows and make sure the delay of loop 2 is exactly $2T_D$. Therefore, it is possible to implement a delay line within a range of [$T_D$, $T_D+T_A$].

The controlling relations between the timing and the data path are the following: signal x.t controls x.d; signal $y_G$.t controls the three inputs of arithmetic block 1608; signal $y_1$.t controls the five inputs of arithmetic block 1610, which includes y'.d and y".d; signal y.t controls y.d; signal y'.t controls $y_1$'.d; signal y".t controls $y_1$".d. All the five inputs of arithmetic block 1610 are controlled by a single timing signal $y_1$. t. Therefore, all five inputs are automatically aligned and do not require a grouping block. Because y.t and $y_1$.t control the input (y.d) and output (y".d) of memory 1612 respectively, the delay implemented by memory 1612 depends on the timing relations between y.t and $y_1$.t. However, three different scenarios can occur: signal $y_1$.t leads y.t by $T_A$; signal $y_1$.t lags y.t by $T_D-T_A$, if a pulse starts from y.t and goes through loop 1; signal $y_1$.t lags y.t by $2T_D-T_A$, if a pulse starts from y.t and goes through loop 2. In the case where signal $y_1$.t leads y.t by $T_A$, a data is read out from memory 1612 even before it is stored, which does not correspond to correct operation. When $y_1$.t lags y.t by $T_D-T_A$, memory 1612 implements a delay of $T_D-T_A$, which is the same delay for memory 1614. When $y_1$.t lags y.t by $2T_D-T_A$, memory 1612 implements a delay of $2T_D-T_A$. Because the scalar block $b_2$ in arithmetic block 1608 is in the second-order path, only the third case results in correct operation. Thus, 3 bits are used in the timing signals to distinguish these three cases. The 3-b timing information is generated at the output of the grouping block 1606. Depending on the input traffic, only one of the three bits can have a pulse at any time. If a window only contains pulses from the feed-forward path (x.t), a pulse is generated on $y_G$.t.0 at the end of the window. If a window contains a feedback pulse from the feedback path y'.t (loop 1), regardless of a feed-forward pulse, a pulse is generated on $y_G$.t.1 at the end of the window. If a window contains a feedback pulse from the feedback path y".t (loop 2), a pulse is generated on $y_G$.t.2 at the end of the window. The pulses on the 3-b timing signal $y_G$.t.{0,1,2} are mutually exclusive. When a pulse propagates from $y_G$.t.0 to $y_1$.t.0, it only sends the data in the feed-forward paths into arithmetic block 1608 (the inputs of the scalars blocks $a_0$, $a_1$ and $a_2$). When a pulse propagates from $y_G$.t.1 to $y_1$.t.1, it reads a data out from memory 1614 and sends it into arithmetic block 1610 together with the data on the feed-forward paths. When a pulse propagates from $y_G$.t.2 to $y_1$.t.2, it reads a data out from both memory 1614 and memory 1612 and send the data into arithmetic block 1610 together with the data on the feed-forward paths. Hence, the time-domain equations of this filter are:

$$y.d(t)=a_0 y_1'.d(t-T_A)+a_1 y_1'.d(t-3T_A)+a_2 y_1".d(t-3T_A)+c_1 y'.d(t-T_A)+c_2 y".d(t-T_A)$$

$$y_1.d(t)=x.d(t-2T_A)+b_1 y_1'.d(t-2T_A)+b_2 y_1".d(t-2T_A)$$

$$y_1'.d(t)=y_1.d(t-T_D+T_A)$$

$$y_1".d(t)=y_1.d(t-2T_D+T_A)$$

$$y'.d(t)=y.d(t-T_D+T_A)$$

$$y".d(t)=y.d(t-2T_D+T_A)$$

Its transfer function is:

$$\frac{Y.D(s)}{X.D(s)} = \frac{a_0 + a_1 e^{-sT_D} + a_2 e^{-2sT_D}}{(1 - b_1 e^{-sT_D} - b_2 e^{-2sT_D})(1 - c_1 e^{-sT_D} - c_2 e^{-2sT_D})} e^{-3sT_A}$$

According to aspects of the disclosure, high-order filters with complex poles and zeros are implemented by cascading more second-order sections to the filter implementation of FIG. 16. Although the data path will have additional scalar blocks, adder blocks, and memories, as the order of the filter increases, the structure of the timing path will be the same as in FIG. 16.

An Event-Driven Delay-Based Continuous-Time Digital Feedback System

Modern mobile platforms leverage the time-varying activity of the input to lower down the power consumption. Power cycling allows a circuit to have power consumption proportional to the input activity by turning off the circuit when not in use. However, a long PLL settling time affects its efficacy. Continuous-time digital signal processing, as an alternative solution, avoids this issue by completely eliminating the clock. Sampling the analog input in the amplitude domain, a continuous-time ADC generates digital samples (a.k.a events) whose rate tracks input activity. The operations in the continuous-time digital signal processors (CT DSP) disclosed herein are event-driven. CT DSPs do not dissipate dynamic power right after an input goes to quiescent state and recover operations after the input becomes active with a zero delay. Without a clock, such systems have a superior spectral feature of aliasing free. The prior art of CT DSPs only implement low-order FIR filters. The filter orders are limited by the number of power-hungry area-consuming delay blocks. According to embodiments, an IIR filter is provided as a CT DSP. A CT DSP with separate timing and data paths, can decouple the number of delay blocks and the filter order, and can allows the implementation of high-order filters, for example, an sixth-order filter descripted herein, with only two delay blocks. The exemplary filter can achieve a 45 dB improvement in stopband rejection compared to prior art implementation. An event-detection block can monitor the signal activities in the feedback loops and can eliminate redundant events whose data values are the same as their previous events. This allows the IIR activity to be mostly dependent on the input and hence has power consumption proportional to the input activity. According to embodiments, an asynchronous-to-synchronous (A2S) converter is provided, which allows a simple integration between the CT-DSP and conventional DT digital systems.

Figure 18:
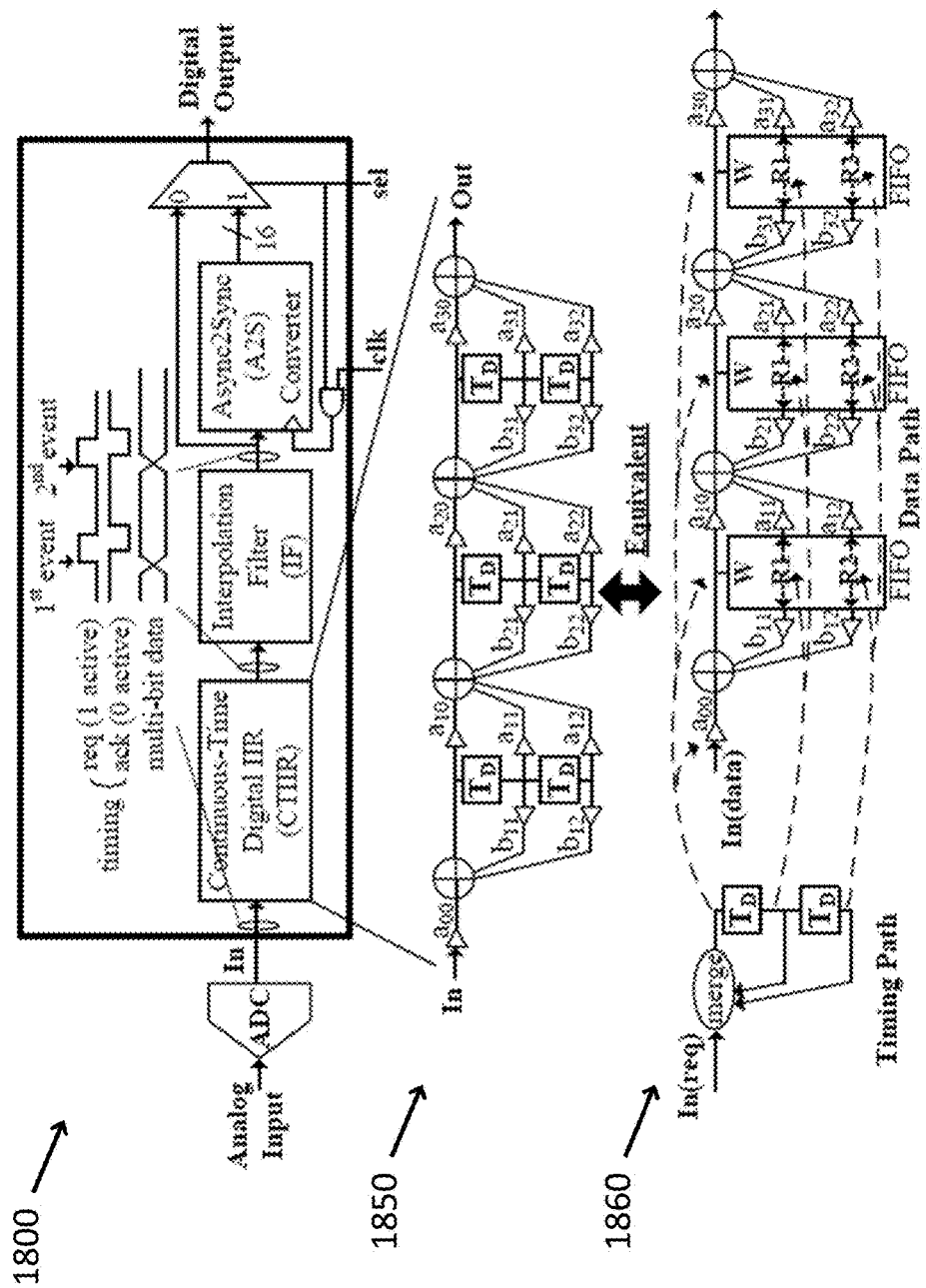
FIG. 18 shows an exemplary implementation of an integrated circuit and exemplary timing path for generating timing signals, according to aspects of the disclosure.

FIG. 18 shows the block diagram of the chip 1800, which is composed of a continuous-time IIR (CT IIR), an interpolation filter (IF) and an A2S converter. The communications between and within these blocks use a 4-phase handshaking protocol to avoid glitches. Although asynchronous techniques are used, the disclosed system is different from asynchronous digital filters as the time different between successive events are key to the signal representation. A sixth order IIR filter is implemented by cascading three second-order sections 1850. Assuming, that the gain and the addition blocks are delay-free and all the tap delays have the same value $T_D$, events arrive at the same tap (0th tap, 1st tap, and 2nd tap) of each section simultaneously. Hence, such a system only has three distinguishable timing signals, one of which is from the input. A timing path 1860 can generate these timing signals. It has one input port, receiving the system input, and two delay blocks in the feedback loop. The three traffics, as shown in 1860 are merged at the input of the first delay block. When an event is generated there, it triggers the operations associated to the 0th taps, including writing FIFOs through the "W" port and arithmetic operations, such as multiplications and additions. An event at the outputs of the first and second delay blocks triggers the reading FIFOs on R1 and R2 ports and new arithmetic operations. The writing and two different reading operations are triggered by three timing signals with a $T_D$ delay between each other. Effectively, this delays the data by $T_D$ from W to R1 and from R1 to R2. This method can be applied to any higher order CT IIR filter designs.

Figure 19:
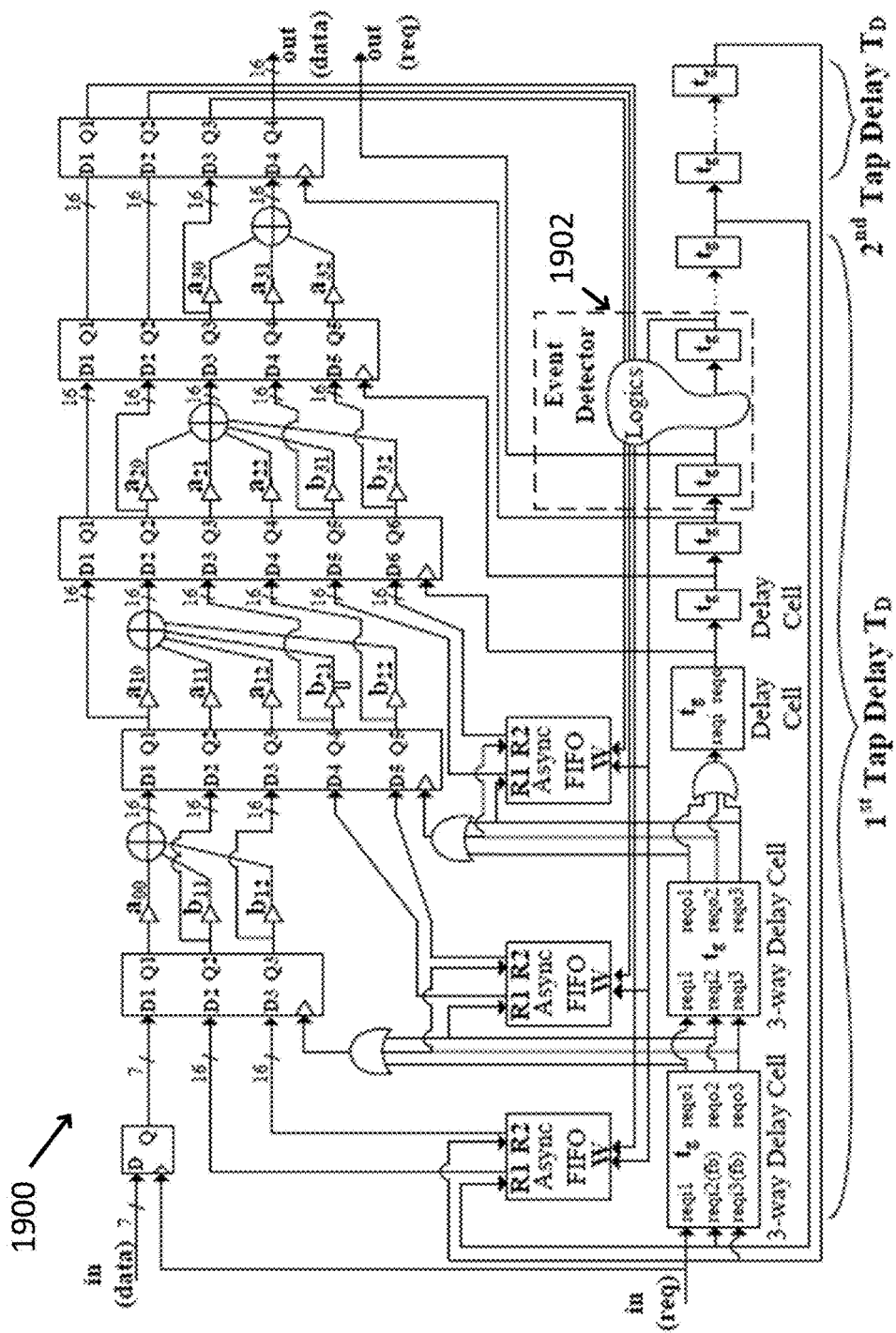
FIG. 19 shows an exemplary implementation of a CT IIR filter, according to aspects of the disclosure.

In practice, propagation delays in the arithmetic blocks, such as adders and multipliers, prevent all the sections to operate simultaneously on one event. An event has to go through each section one by one. FIG. 19 shows the implementation of the CT IIR 1900 in an asynchronous pipeline. The data path shown at the top portion of FIG. 19 consists of six stages. Each stage begins with a data flip-flop (DFF) followed by combination logic. The timing path shown at the bottom portion of FIG. 19 contains two tap delays, each of which is a concatenation of many delay cells with a uniform delay granularity Tg. The minimum value of Tg can be larger than the maximum prorogation delays among all six stages. The beginning of the timing path sees three input traffics. Because they trigger different FIFO operations, they are kept separated in the signal flow until no more FIFO operation is needed. The operation of the pipeline starts with an event arriving at any of the three inputs of the delay line. It triggers a Tg delay in the timing path, and may latch DFF in the stage 1 or read out a new data from the 1st FIFO, which will be used at stage two. After a "tg" delay, a req "signal" is asserted at the output of a first three-way delay cell. The signal latches the DFFs in stage two and triggers a new arithmetic operation, and may read out a new data from the second FIFO. Similar operations occur in the following four stages and a new output event is generated with a latency of six "tg". The summation results in stages two, three, and four are not immediately stored into FIFOs right after their generation. Rather, they propagate in the data path and wait until all the three results are generated. After that, they can be written into three different FIFOs on one "req" signal.

Figure 20:
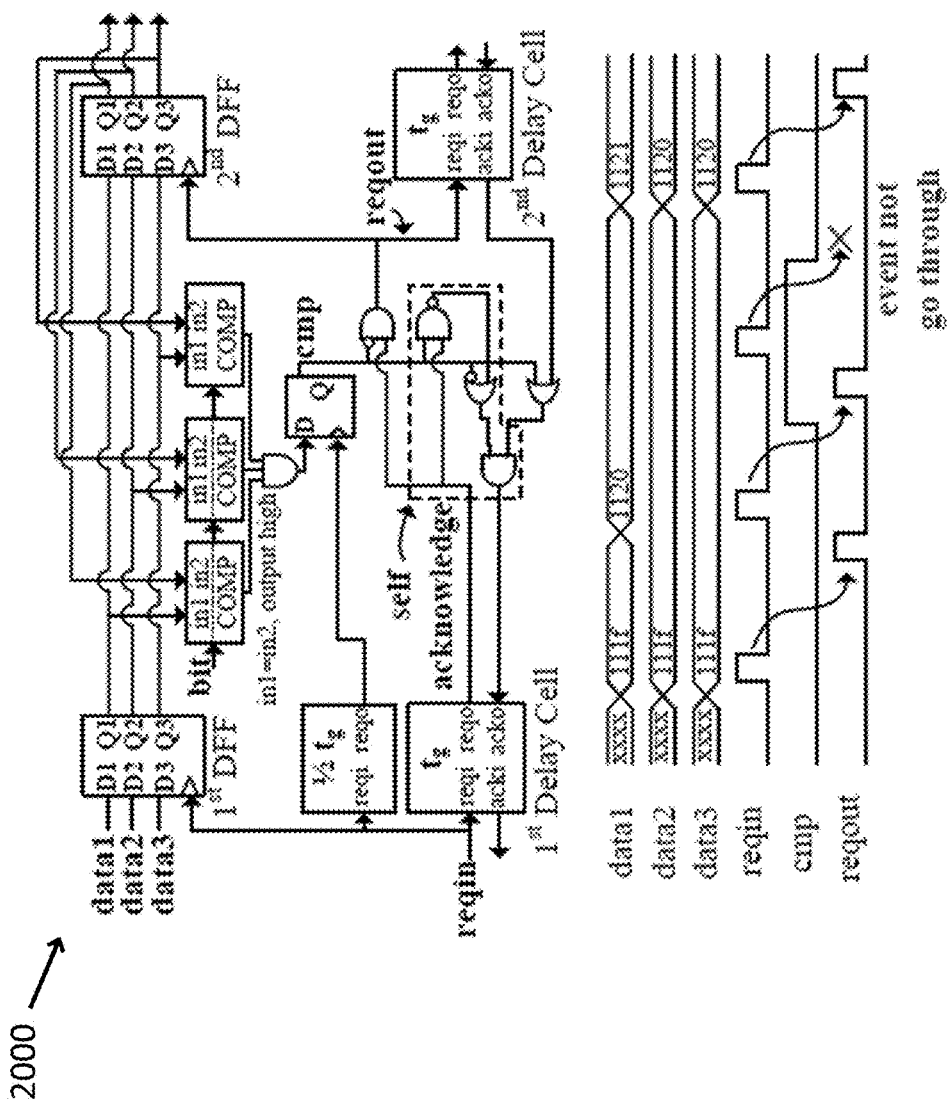
FIG. 20 shows an exemplary implementation of an event detector, according to aspects of the disclosure.

The timing path becomes a non-stop oscillator after the first event enters the timing path. If there is no data update, the oscillation generates unnecessary events that waste energy. An event detector 1902 can be inserted in the feedback loop of both timing and data paths to address this problem, as discussed above, and as shown in FIG. 19. An exemplary event-detector implementation is shown in FIG. 20 at 2000. When an event enters the detector, it triggers the first delay cell. All the three data are saved in the first DFF. In the meantime, they are compared with the data of the previous event. The comparison delay is shorter than half "tg" so that the result, at signal CMP, is properly latched. When any of the three data values is different from the previous ones, the CMP is a logical zero ("0") and the current event passes into the second stage. If all three data values are the same, then the event is identified as a redundant event. CMP is set to logic one ("1") to prevent it from entering the 2nd stage. In this case, a self-acknowledge is conducted at the output of the first delay cell to allow the asynchronous pipeline to continue working.

Figure 21:
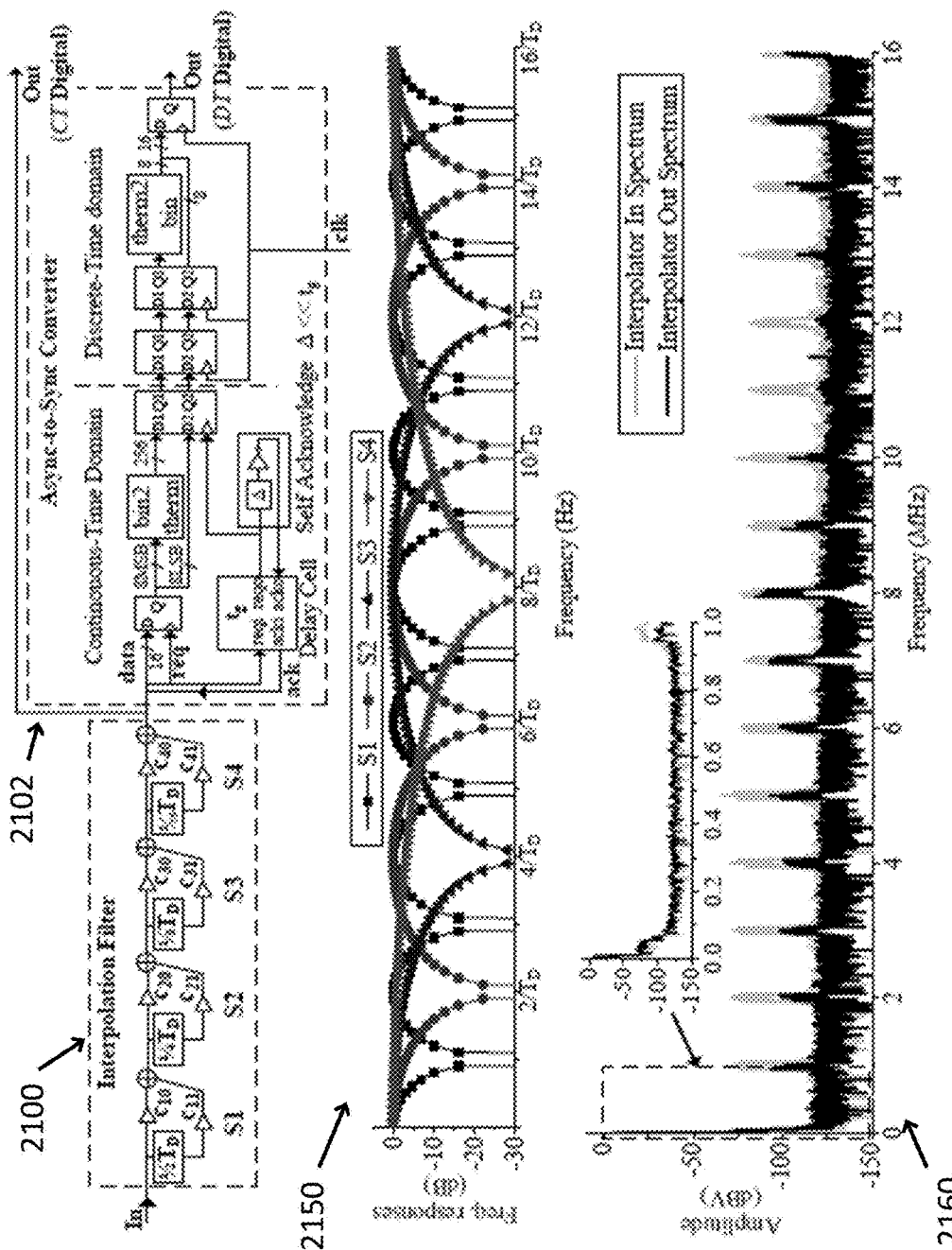
FIG. 21 shows an exemplary implementation of an interpolator, according to aspects of the disclosure.

The use of tap delays makes the frequency responses of the IIR periodic with a frequency period of $1/T_D$. For example, when the IIR is configured as a lowpass filter, all the repetitive passbands around $k/T_D$, k=1,2, . . . preserve distortion and noise power. It stays out of band if the continuous-time digital signal is the final output. On the other hand, when a DT digital output is desired, sampling folds all the out-of-band power into the in-band and degrades the signal-to-noise distortion ratio (SNDR). To alleviate the damage caused by aliasing, an interpolation filter can be inserted before the asynchronous-to-synchronous conversion. The interpolation filter 2100 shown in FIG. 21 consists of four first order FIR sections. When the tap delays of these sections are ½ $T_D$, ¼ $T_D$, ⅛ $T_D$, and ¹⁄₁₆ $T_D$, with all tap coefficients set to 0.5, the filter implements notches at $(k+16n)/T_D$, k=2, . . . , 15, n=1,2, . . . FIG. 21 also shows an asynchronous-to-synchronous converter 2102 after the interpolation filter 2100.

FIG. 21 also shows the spectra 2150 before and after the interpolation filter when the input to the chip is a full-scale 5 kHz sin wave and the IIR filter is configured as a lowpass filter with a TD=1 us and fc=50 kHz. The notches suppress the distortion and noise power, and push away the first intact repetitive passband to 16/TD. The distortion and noise power over [0,+∞) frequency range matters as out-of-band components will be aliased into the inband after sampling. SNDRs before and after the interpolation filter are 47.9 dB and 56.5 dB respectively. Because the delay lines are much shorter and the arithmetic operations are simpler in the interpolation filter than in the IIR filter, the 8.6 dB improvement is obtained with small hardware and power penalties. A similar interpolation filter can also be designed for highpass and bandpass cases.

The effect of the interpolation filter is illustrated in FIG. 21 at 2160. The gray curve shows the spectrum at the input of the interpolation filter (the output of the CT digital IIR filter) when the IIR filter is configured for lowpass operation. The testing input is a full-scale 5 kHz sine wave digitized by an off-chip 7-bit ADC at 20 MHz. Noise and distortion power are preserved at the repetitive pass-bands, which are around 1 MHz, 2 MHz . . . The black curve shows the spectrum at the output of the interpolation filter. The noise and distortion power are suppressed by the notch formed in the interpolation filter. The CT digital data is acquired from the input and output of the interpolation filter using a data acquisition instrument with a 500 MHz sampling clock. Since this rate is much higher than the bandwidth where the majority of the signal power is located (5 kHz), the acquired discrete-time digital signal is a very good representation of the original continuous-time digital signal. Conducting FFT analysis on both signals, it is shown that the SNDRs at the interpolator input and output from 0 to 250 MHz are 48 dB and 57 dB respectively.

Although a CT digital signal is free of aliasing, and allows a digital system to have activity-dependent power consumption, the intervals between two successive events vary, and this prevents its simple integration with standard systems operating under a fixed clock rate. An async-to-sync conversion is necessary. A common synchronization method is to sample the CT digital signal with two DFFs sharing a same clock. The two DFFs assure the final output to be in a stable state with a good confidence. However, when a sampling occurs at the vicinity of a data update, each of the 16 bits has an equal chance to settle to a wrong stable state. This can add error power in the synchronized output, with the error on most significant bit (MSB) having the most significant effect. On the other hand, a CT digital signal has a very high data rate (1/tg) compared to its signal bandwidth. Two successive events in the CT digital signal cannot have a big change. For example, assuming the change is always less than 2 k*LSB (k<15). If a thermometer code is used to represent the CT digital signal, each data change can only cause up to 2 k bits to flip, while the others will be unchanged. The error introduced by metastability in sampling the thermometer code is constrained up to k-th least significant bit (LSB). All the higher significant bits are error free. FIG. 21 shows async-to-sync converter 2102, which changes the binary code to a thermometer code in the continuous-time domain. To lower the hardware cost, only 8 MSBs are converted to a 256-b code. After a two-DFF synchronization, the thermometer code is converted back to binary form. The SNDR is measured as 57.7 dB. The error power introduced by the async-to-sync converter is negligible.

Figure 22:
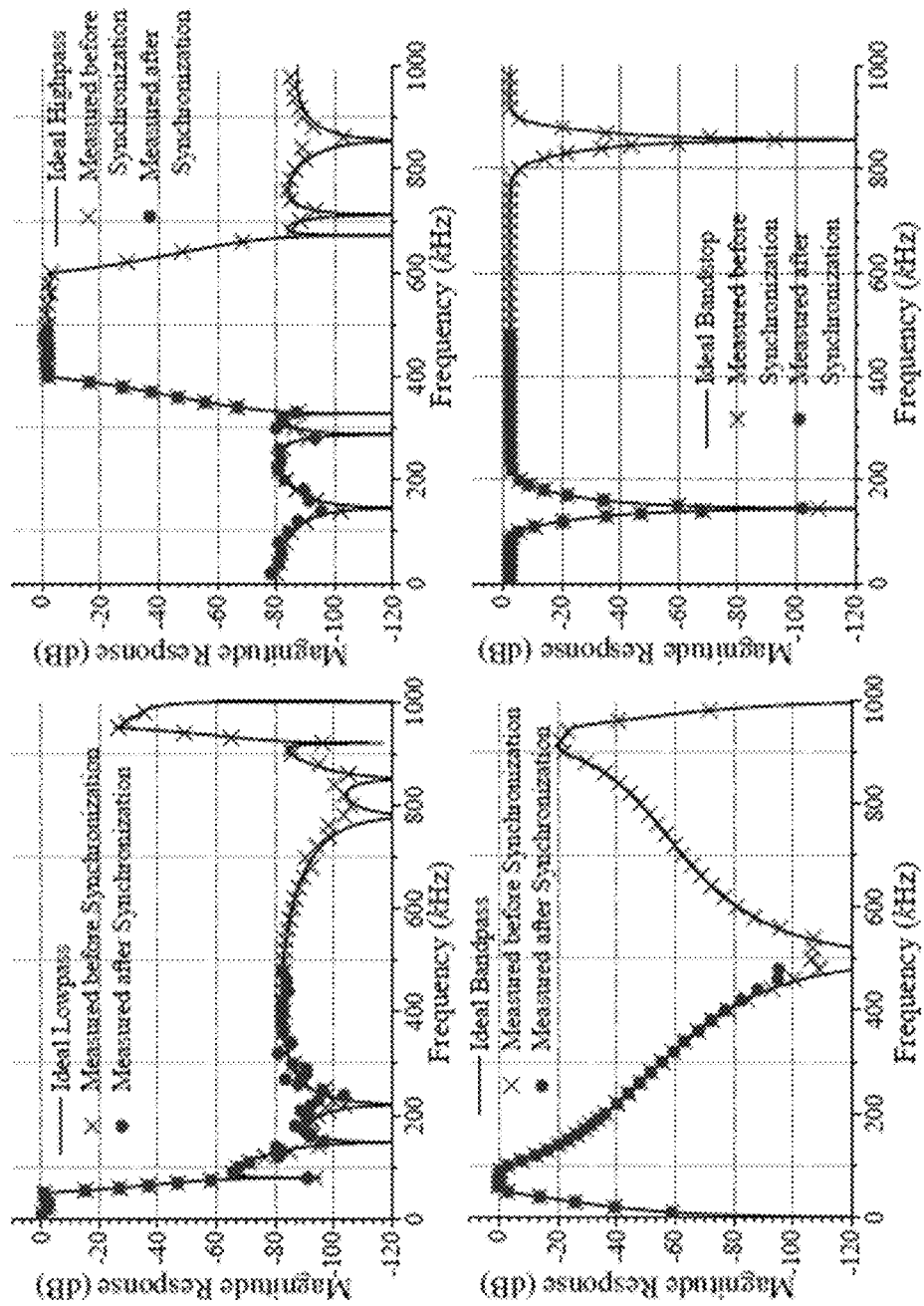
FIG. 22 shows exemplary frequency responses for different configurations of a filter, according to aspects of the disclosure.

FIG. 22 shows the frequency responses 2200 when the filter is configured as a sixth lowpass, high-pass, band-pass, and band-stop filters with a 1 us tap delay and 10b coefficients. Responses are measured both from the chip input to the output of the interpolation filter and to the output of the asyn-to-sync converter with a sampling clock fs=1 MHz. A discrete-time signal allows measuring the response only up to fs/2. In the lowpass and bandpass cases, the first repetitive passband around $1/T_D$ is suppressed by the notches from interpolation filter. Because the three second-order sections in the IIR filter rely on the same delay blocks to generate the timing signals, the filter can be robust to delay mismatches, which results in a good match between ideal and measured results. The sixth-order IIR filter can implement frequency responses with a stopband suppression lower than −80 dB.

Figure 23:
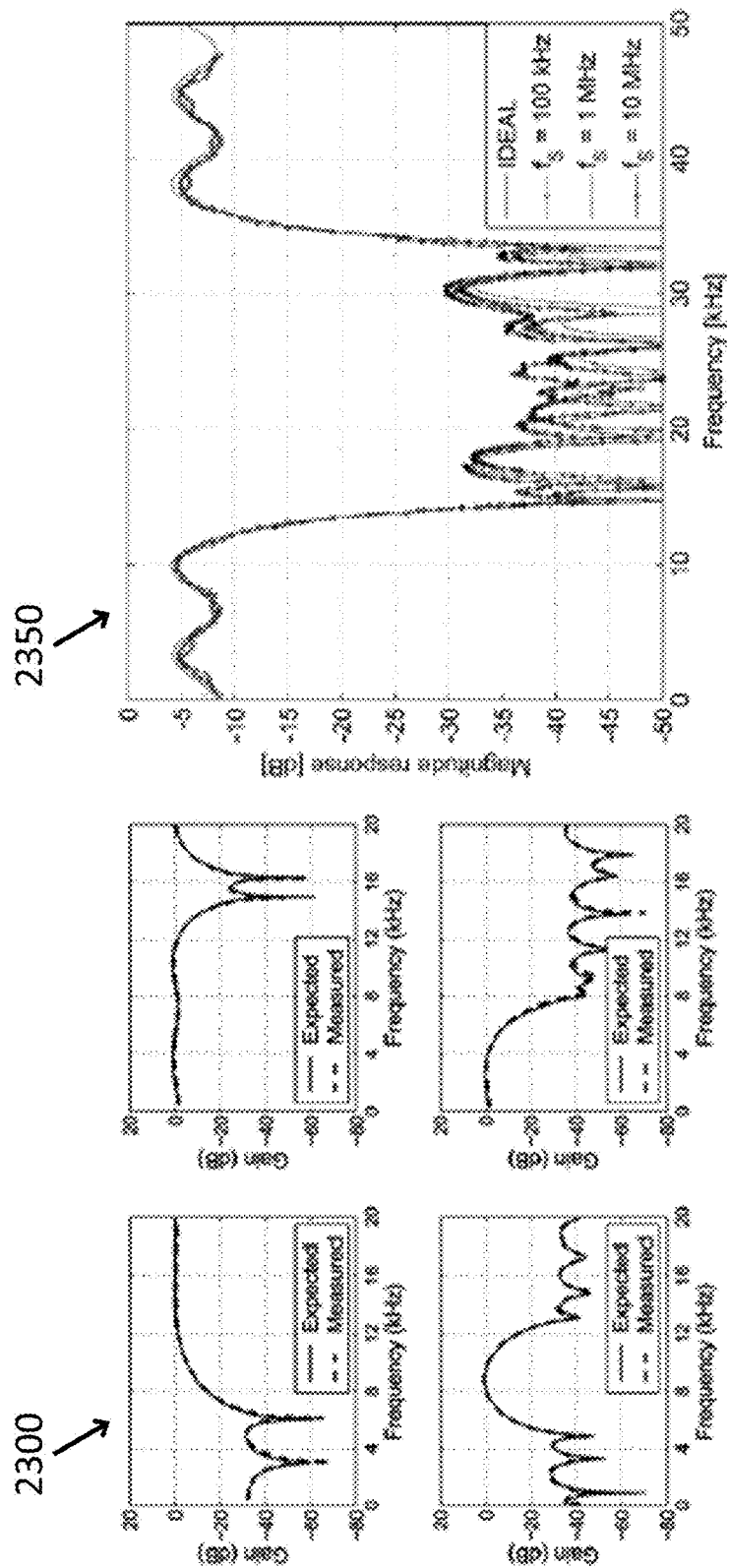
FIGS. 23A-B show exemplary frequency responses, according to aspects of the disclosure.

Comparing the frequency responses of the recursive CT DSP in FIG. 22 and the transversal CT DSPs in FIG. 23 (2300, 2350), the former has the following advantages:

(1) It has a much better suppression in the stop bands (<−80 dB).
(2) It has a much better selectivity.
(3) Its frequency response is robust to delay line mismatches.
(4) It is more efficient in terms of hardware implementations (6th order vs. 15th order).

Figure 24:
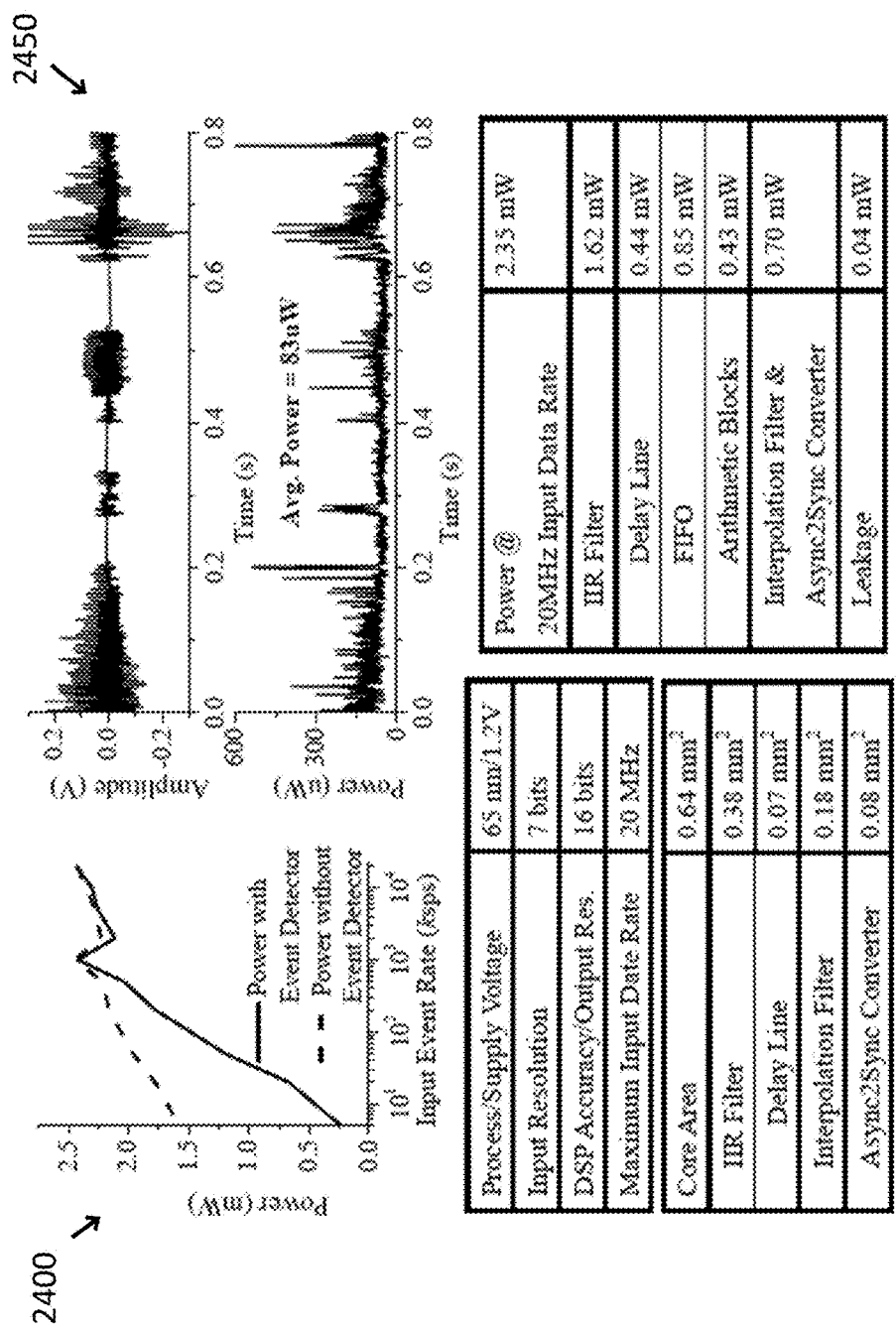
FIG. 24 shows power consumption and amplitude information of a CT DSP, according to aspects of the disclosure.

Since all the operations in the designed system are event driven, its dynamic power consumption depends on the event rates both at the input and in the feedback paths. FIG. 24 at 2400 shows the power consumption versus the input event rate. When the event-detector is on, it eliminates all the redundant events in the feedback loops. The power consumption has a strong dependence on the input event rate. When the event-detector is off, redundant events can oscillate in the feedback loops and maintain a high event rate regardless of the input. On the other hand, when the input rate is low, the data values of the events in the system have a less chance to change. Hence the power is still weakly dependent on the input. FIG. 24 also shows a table 2402 with process/supply voltage information, core area information, and power consumption information. FIG. 24 also shows a speech signal and the measured power consumption of the CT DSP 2450. The speech signal is digitized by a continuous-time ADC before fed into the DSP. As seen, when the input is active, the power increases up to 600 uW, since there is much activity in the system. When the input is static, the DSP settles to a quiescent state with redundant events eliminated by the event detector. The power drops to the leakage level (40 uW). The average power is 83 uW.

FIG. 25 shows the die photo 2500 of the exemplary of the sixth-order IIR filter and compares at 2502 the disclosed IIR filter with prior-art CT and DT DSPs. A figure of merit for comparing the efficiency of the digital processor is given by the equation:

$$FoM = \frac{\text{Power}}{f_{max} * 2^{ENOB} * NK}$$

In equation above $f_{max}$ is the maximum input rate and N the filter order, and K the ratio by which an IIR's filter order is smaller than that of an FIR filter that would be needed in order to achieve the same frequency response specs. K is used in order to reveal the definite selectivity advantage of IIR filters, compared to FIR; if the filter under consideration is FIR, K=1. The disclosed system achieves a FoM better than all the CT digital design. In addition, the chip implements an IIR architecture, signal-derived timing and synchronous output. The system's 16-bit arithmetic resolution is much higher than that in prior art CT digital solution. Both the IIR architecture and the larger number of bits contribute to a much more accurate and versatile frequency response performance. Its FoM also compares well with that of DT analog and digital filters. However, as a digital filter, the disclosed system has a programmability that cannot be achieved by prior art analog filters. The disclosed system does not use a clock (except for output data synchronization) and an antialiasing filter, both of which are necessary in prior art DT filters and can be power hungry. In contrast to prior art analog designs, the disclosed system features agile power adaptation to input activity.

Figure 26:
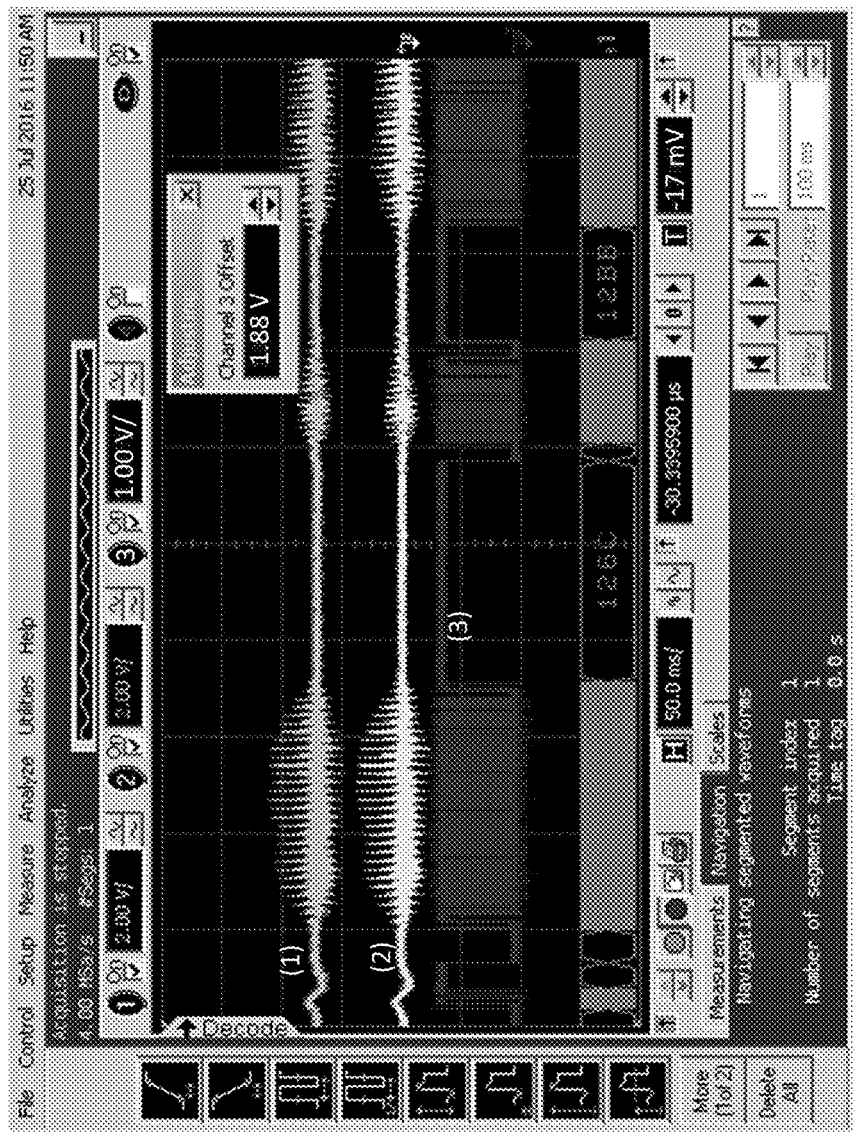
FIG. 26 shows the output of an exemplary CT DSP implementation, according to aspects of the disclosure.

FIG. 26 shows the response 2600 of the CT DSP when is configured as a sixth order lowpass filter. The input of the ADC-DSP system is a burst-mode voice signal. It is active for a part of the entire duration and is quiescent in the rest. When the input is active, the ADC-DSP system properly processes it. When the input goes into quiescent regions, the ADC-DSP stops operations at its settled state, and hence doesn't consume any dynamic power. This indicates that the ADC-DSP system is event driven.

Figure 27:
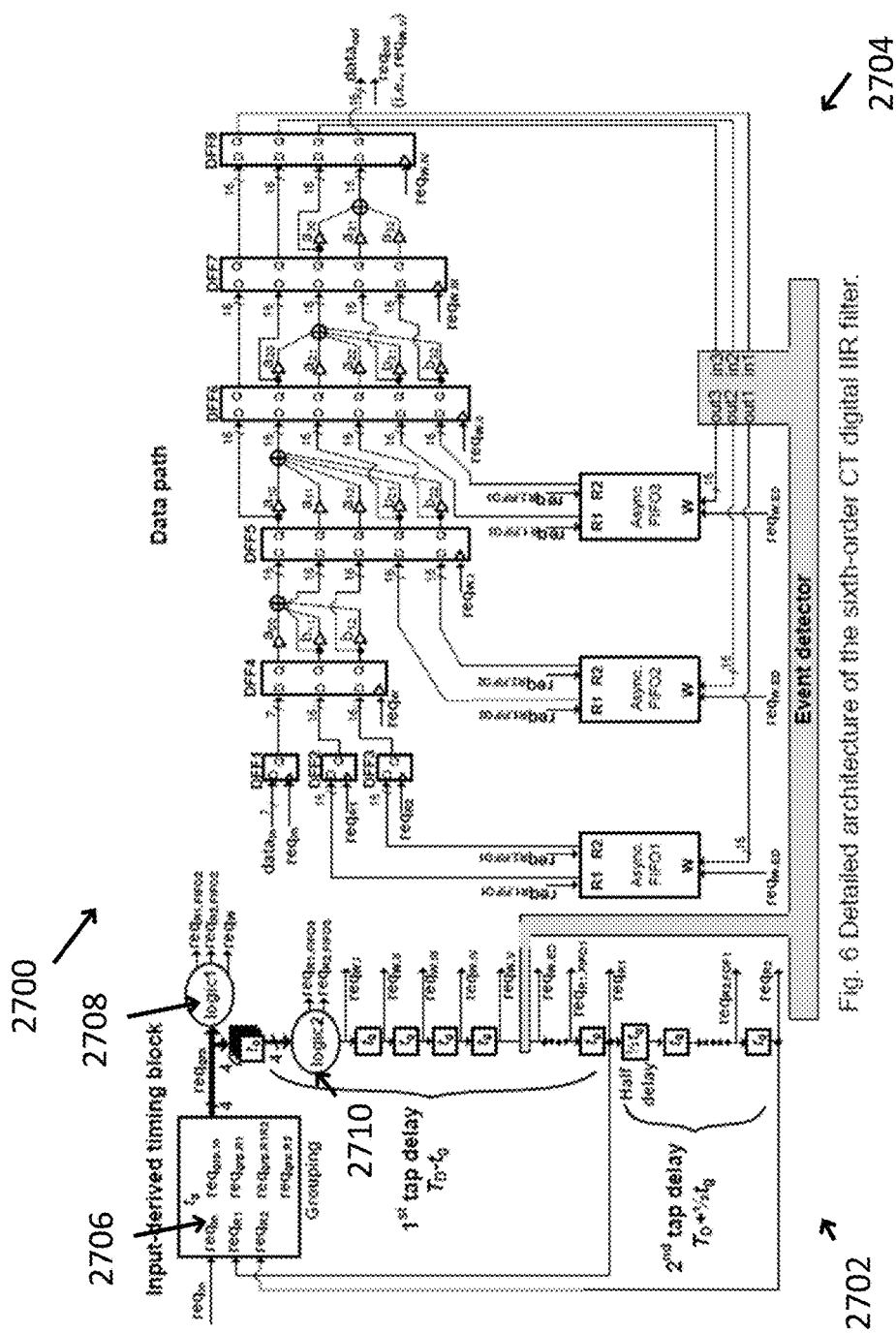
FIG. 27 shows an exemplary implementation of a CT IIR filter, according to aspects of the disclosure.
Figure 28:
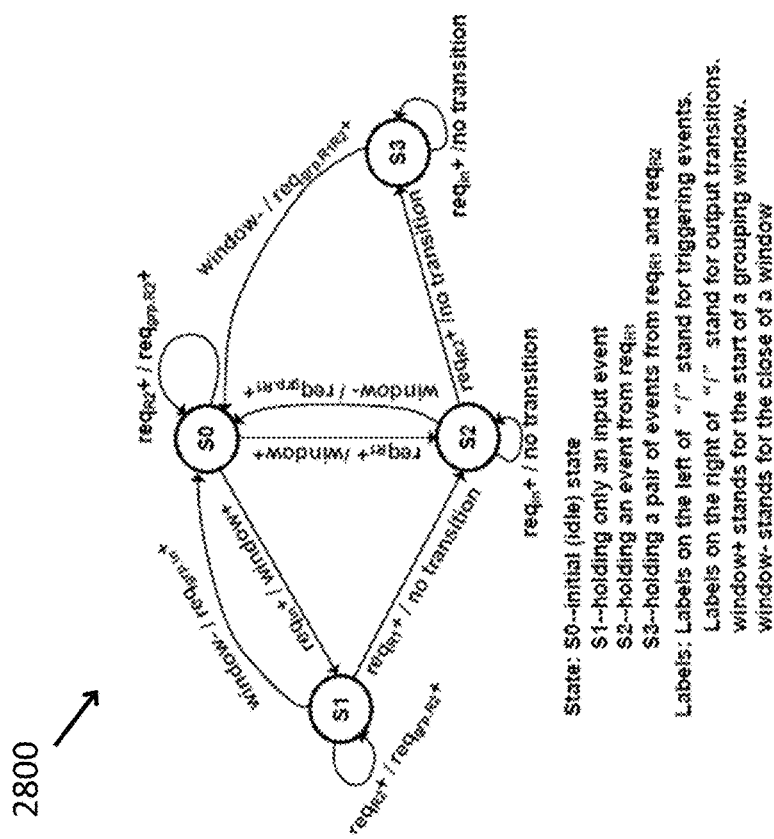
FIG. 28 shows an exemplary state diagram of grouping block's operation, according to aspects of the disclosure.

FIG. 27 shows an alternative implementation 2700 of the sixth order IIR filter of FIG. 19. Specifically, FIG. 27 shows the architecture of the timing block. The grouping block and an extra half-delay cell in the second tap delay implement a grouping solution as has been discussed herein. The length of the grouping window, $t_g$, can determine the minimum inter-event spacing in the feedback path. It can be much smaller than the tap delay $T_D$. In a CT DSP, the spacing between events carries information about the signal. Since the minimum supported inter-event delay is $t_g$, a CT delay line can be constructed by using a chain of delay cells, each contributing a delay of $t_g$. This approach can delay events without distorting their timing relative to each other. The grouping block 2706 takes $req_{in}$, $req_{R1}$ and $req_{R2}$ as its inputs and can generate a four-bit output, $req_{grp}$). The four output bits can correspond to four possible grouping scenarios: (i) if a window only contains an input event from $reg_{in}$, then $req_{grp.in}$ is pulled up—this discussion involves the rising transition of the "req" signals; a person of skill would understand that a four-phase handshake can be completed after this transition, pulling the "req" signals back to zero so that the block can be ready to accept another event—(ii) if a window contains an event from $req_{R1}$ but no event from $req_{R2}$, $req_{grp.R1}$ is pulled up; (iii) if a window contains events both from $req_{R1}$ and $req_{R2}$, $req_{grp.R1R2}$ is pulled up; (iv) the grouping solution requires that the event from $req_{R2}$ must arrive within the window triggered or extended by the previous event from $req_{R1}$. According to aspects of the disclosure, the grouping block 2706 can handle $req_{R2}$ events arriving at another time. When this happens, the grouping block 2706 can pull up $req_{grp.R2}$ without triggering a window. FIG. 28 shows the operations 2800 of the grouping block 2706 using an asynchronous state diagram, which is discussed below.

FIG. 27 also shows the architecture of the data path 2704. According to embodiments, data path 2704 can be implemented in an asynchronous pipeline with bundled data to keep a high throughput. The adders of the sixth-order IIR filter can be spread over four stages (DFF4 to DFF7), so that they can operate concurrently. The timing signals derived in the timing block can be used to control the pipeline operations. For example, three events, one from each of $req_{in}$, $req_{R1}$ and $req_{R2}$, can arrive at the inputs of the grouping block 2706 within one grouping window. Upon their arrivals, the associated data are latched into DFF1-3 respectively. The read operations in FIFO1, triggered by $req_{R1.FIFO1}$ and $req_{R2.FIFO1}$, can start $t_g$ earlier than the triggering of DFF2-3, leaving a $t_g$ timing margin for the FIFO read. Because two feedback events are present in this grouping window, at the end of it, $req_{grp.R1R2}$ is pulled up, which then pulls up $req_W$, $req_{R1.FIFO2}$, $req_{R2.FIFO2}$ through the logic 1 block 2708. The rising edge on $req_W$ latches all data in DFF1-3 into DFF4, effectively aligning three events to one timing signal, and triggers a new set of arithmetic operations. The rising edges on $req_{R1.FIFO2}$ and $req_{R2.FIFO2}$ can trigger read operations in FIFO2 to prepare for the arithmetic operations in the next stage in the data path. After a $t_g$ period, $req_{WT}$, $req_{R1.FIFO3}$ and $req_{R2.FIFO3}$ are pulled up by the logic 2 block 2710, which latches data into DFF5 and can trigger read operations in FIFO3. The calculated data then moves forward in the pipeline with a constant inter-stage delay, $t_g$. The final result is ready at $data_{out}$ upon the rising edge of $req_{W.V}$. Three intermediate results of feedback paths are stored in FIFOs at the same time after going through an event detector block.

Because the four bits at the grouping block's output trigger different FIFO operations, they propagate separately in the delay line until no further FIFO operations are needed. Logic1's functions are the following: $req_{R1.FIFO2}$ is high if either $req_{grp.R1}$ or $req_{grpR1R2}$ is high; $req_{R2.FIFO2}$ is high if either $req_{grp.R2}$ or $req_{grp.R1R2}$ is high; reqw is high if any of $req_{in}$, $req_{grp.R1}$ or $req_{grp.R1R2}$ is high. Logic2 implements the same functions as logic1, but takes the delayed version of $req_{grp}$ as its input.

A person of skill would understand that, although an asynchronous pipeline is used, the disclosed CT DSP is different from an asynchronous DSP, because the timing signals, which are used for the signal representation, are being monitored by the timing block.

The timing block 2702 in FIG. 27 contains closed-loop paths. If there is no data change at the arithmetic block outputs, activities regenerated in the timing block can be ignored to preserve energy. To facilitate this, an event detector (gray in FIG. 27) can be used to monitor the feedback traffic and control the timing block 2706. For example, if all three data associated with an event are the same as the previous event, the new event is considered as redundant and can be eliminated by the detector.

According to embodiments of the present disclosure, the events from Tap2 always arrive within the window activated by the previous event from Tap1. According to embodiments of the present disclosure, the event detector only controls the first tap delay. According to further embodiments, after an event is eliminated from the first tap delay, its paired event in the second tap delay may arrive at the grouper outside of any window, which violates the requirement that events from Tap2 always arrive within the window activated by the previous event from Tap1. As disclosed above, according to embodiments, this isolated event is ignored. When the isolated event from Tap2 arrives at the grouping block, $req_{grp.R2}$ is pulled up without triggering a grouping window. Data can be read out from R2 of FIFO1-3 sequentially, without being latched into any DFF in the data path.

Figure 29:
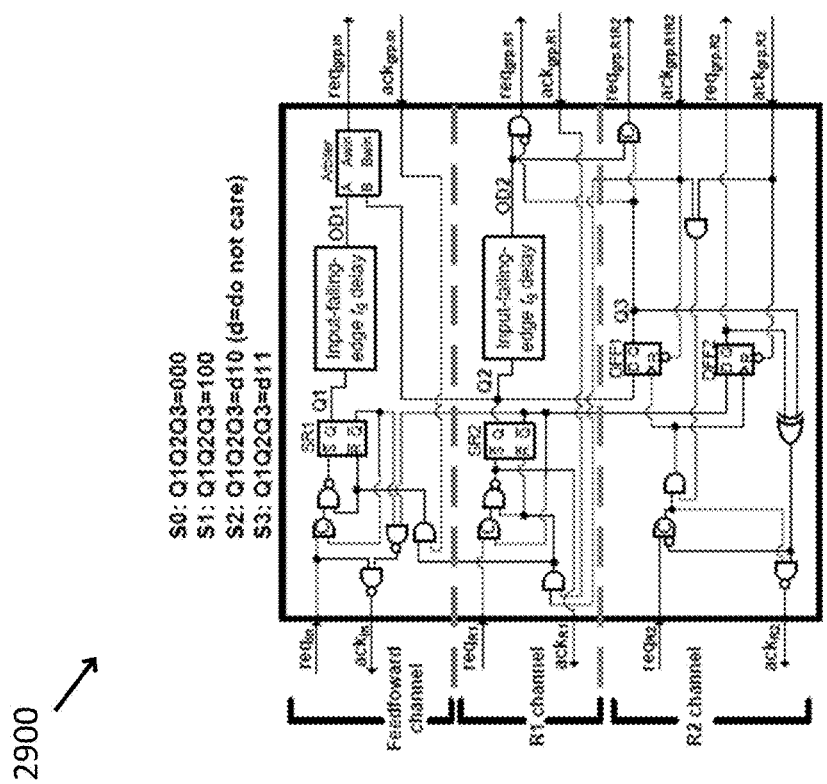
FIG. 29 shows an exemplary circuit implementation of the grouping block in an IIR filter, according to aspects of the disclosure.
Figure 30:
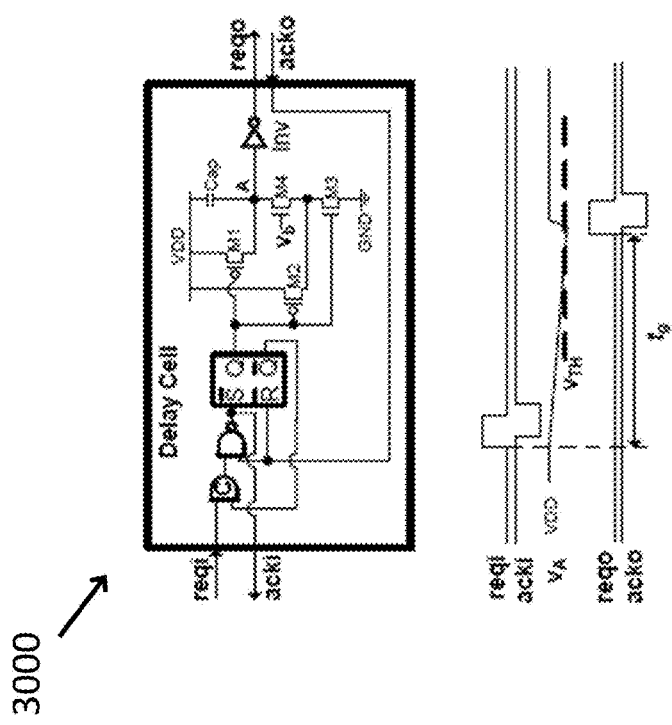
FIG. 30 shows an exemplary circuit implementation and timing diagram of a delay cell, according to aspects of the disclosure.

FIG. 29 shows an exemplary schematic 2900 of the grouping block 2706. It can include three channels, with interconnections between them. The feedforward and R1 channels can implement two delay cells. The input-falling-edge $t_g$ delay block is a simplified view of part of the delay cell shown in FIG. 30. The block can implement a $t_g$ delay for the falling edges at its input. The discussion of the block's operations refers to the state diagram in FIG. 28. The state of the block is stored in three registers: SR1&2 and DFF1. In state S0, Q of all latches and DFFs are low; the outputs of all C-elements are low; all req are low and all ack are high. When an input event arrives, it triggers a delay operation in the feedforward channel by pulling up Q1. The block enters state S1. After a period of $t_g$, input A of the arbiter can be pulled up. With Q2 staying low, the arbiter pulls $req_{grp.in}$ up and the input event is moved to the next stage. After the following stage accepts the event, $ack_{grp.in}$ is pulled down to reset the feedforward channel. The block moves back to S0. If an event arrives at $req_{R1}$ during state S1, the grouper enters state S2. Q2 is pulled up to prevent $req_{grp.in}$ being pulled up through the arbiter. Meanwhile, it triggers a delay operation in the R1 channel. After a period of $t_g$, OD2 is pulled up. With Q3 low, $req_{grp.R1}$ is pulled up. However, if an event arrives at $req_{R2}$ during state S2, the block enters state S3 and Q3 is pulled up. Instead of $req_{grp.R1}$, $req_{grp.R1R2}$ is pulled up upon the completion of the delay operation in channel R1. In either case, an acknowledge signal is received soon thereafter, to reset the block back to state S0. If an event arrives at $req_{R2}$ while Q2 is low, DFF2 outputs a high, which pulls $req_{grp.R2}$ up. When this happens, $ack_{grp.R2}$ is pulled low to reset DFF2. The transition of DFF2 from reset to set to reset again completes quickly without affecting the state of the grouper.

According to embodiments, the delay cell 3000 can use four-phase handshaking to communicate with neighboring delay cells. The delay cell 3000 can be in the idle state. Both reqi and reqo are low and acki and acko are high. When an event arrives from the left, reqi is pulled up, sets the SR latch and charges the capacitor. In the meantime, acki is pulled down to reset the preceding stage. When the voltage on node A falls below the threshold of the inverter, reqo is pulled up. The event passes from reqi to reqo. The time difference between the rising edges of these two signals is defined as the cell's delay, $t_g$. Once the following stage accepts the event on reqo, acko is pulled down to reset the current delay cell. The value of $t_g$ is tunable through the bias voltage of the current source M4, vb. A half-delay cell can be implemented with the same design, where M4 is at least twice as wide.

Figure 31:
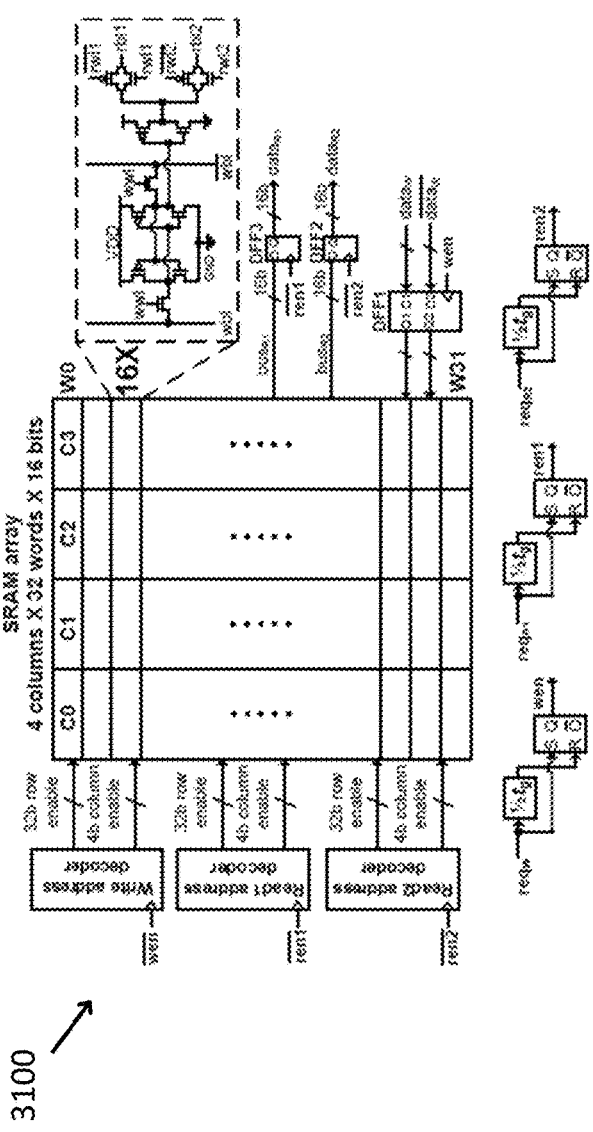
FIG. 31 shows an exemplary architecture of an asynchronous FIFO with one write and two read channels, according to aspects of the disclosure.
Figure 32:
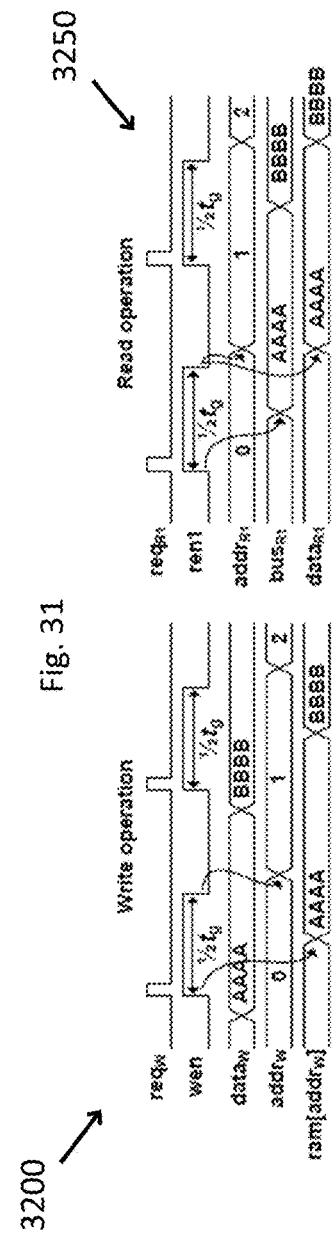
FIG. 32 shows exemplary timing diagrams of write and read operations of an asynchronous FIFO, according to aspects of the disclosure.

According to aspects of the disclosure, FIG. 31 shows the architecture of an exemplary asynchronous FIFO 3100 with one write (W) and two read (R1 and R2) channels. The asynchronous FIFO includes 128 16-bit-word cells, arranged in 4 columns by 32 rows. The SRAM cell can be a static cell with two read channels. FIG. 32 shows the timing diagram of the write operation 3200 and the read operation 3250. Both operations can be triggered by the timing signals $req_W$, $req_{R1}$ and $req_{R2}$, which are not synchronized to a clock. A write operation starts when $req_W$ is pulled up. A bundled data encoding scheme assures that $data_W$ is ready before the timing signal. Signal wen is pulled up to latch $data_W$ into DFF1 and starts writing the cells pointed by the address $addr_W$. After $t_g/2$, wen is pulled down and $addr_W$ increases by one to prepare for next write operation. According to aspects of the disclosure, the write delay is shorter than $t_g/2$, so that it can complete before the $addr_W$ changes. A read operation starts when either of $req_{R1}$ or $req_{R2}$ is pulled up. Operation 3250 illustrates an example when $req_{R1}$ is pulled up. Signal ren1 is then pulled up to read the SRAM cells pointed by the address $addr_{R1}$. After a read delay shorter than $t_g/2$, data is ready on $bus_{RJ}$. Signal $t_g/2$ after $req_{R1}$ is pulled up, ren1 is pulled down and latches the new data into DFF3. Meanwhile, $addr_{R1}$ increases by one to prepare for the next read operation. The three addresses $addr_W$, $addr_{R1}$ and $addr_{R2}$ are internal signals in the three address decoders. They increase by one at the falling edges of wen, ren1 and ren2 respectively, and are decoded into 32-bit row-enable and 4-bit column-enable signals each and select the wanted cells. Because the three decoders operate independently, the asynchronous FIFO supports one write and two reads operations simultaneously.

Figure 33:
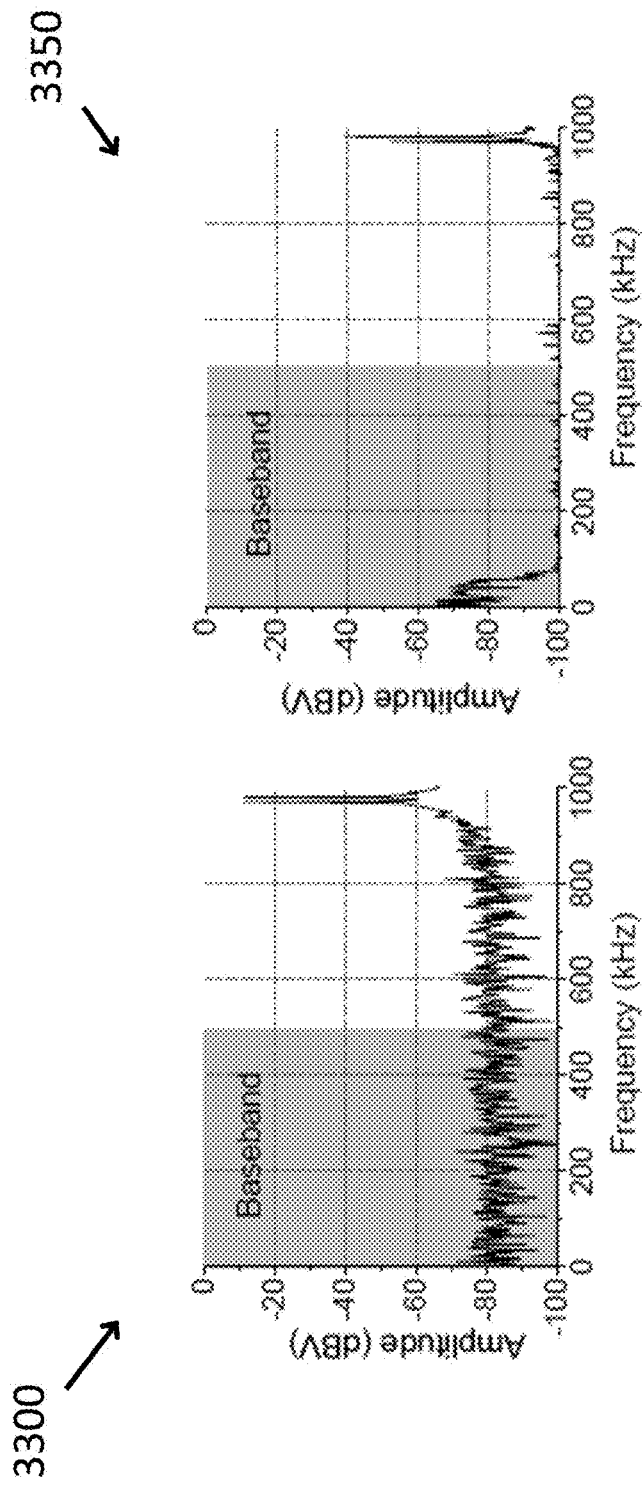
FIG. 33 shows the spectrum of an IIR filter input and output for an out-band two-tone test.

FIG. 33 shows the input (3300) and output (3350) spectra of a filter according to aspects of this disclosure with two out-band full-scale tones at 970 kHz and 980 kHz. These two tones are in the repetitive passband of the IIR filter's frequency response, but are attenuated by the notches implemented in the interpolation filter. The output spectrum demonstrates the alias-free feature of the CT digital filter. No components are aliased back into the baseband. By contrast, if the same input is fed into a DT digital filter with the same frequency response, full aliasing will be observed.

By inserting an event-detection into the feedback loop of a continuous-time digital system, the system can automatically stop when there is no event in the system. Only when new events are detected will the system restart to operate. Thus, the event-driven feature of this feedback system is maintained. The block can be inserted at any point of the loop. In addition, a large system can be implemented by using multiple feedback loops to handle more complicated tasks. Each individual loop needs an event-detection block to monitor its traffic independently.

According to embodiments, a new way to build continuous-time digital systems by implementing the timing paths and the data paths separately is provided. According to alternative embodiments, an event-grouping method to enable the realization of feedback system with practical delays. The two parts together allow the implementation of recursive continuous-time digital signal processors. Comparing with existing continuous-time digital signal processors, recursive ones are more area and power efficient. In addition, because of the introduction of complex poles, filters with high-quality factors become possible (transversal filters contain only zeros and thus cannot realize filters with high-quality factors).

In fact, many other fields use feedback systems. For example, in a control system, the integration path of a PID controller requests a feedback path. In the computer to solve ordinary differential equations, integration requests a feedback path too. Hence, the realization of recursive continuous-time digital systems expands their applications into control and computation.

The invention claimed is:

1. A continuous-time digital signal processor comprising:
   an event-grouping block, configured to receive a first input timing signal, a second input timing signal, and to generate an intermediate timing signal;
   a first time delay block, configured to receive the intermediate timing signal and generate an output timing signal;
   a second time delay block, configured to receive the output timing signal and generate the second input timing signal;
   a two-channel memory configured to receive a first data input and a second data input and to generate a first intermediate data signal and a second intermediate data signal;
   an arithmetic operation block, configured to receive the first intermediate data signal, the second intermediate data signal and to generate an output data signal, the arithmetic operation block comprising:
   a scalar block configured to receive the second intermediate data signal and generate a scaled version of the second intermediate data signal; and
   an adder configured to receive the first intermediate data signal and the scaled version of the second intermediate data signal, and generate the output data signal; and
   a first-in-first-out (FIFO) memory configured to receive the output data signal and to generate the second input data signal.

2. The continuous-time digital signal processor of claim 1, wherein the adder is configured to receive data at the first intermediate data signal and calculate the output data signal, in response to a pulse on the intermediate timing signal.

3. The continuous-time digital signal processor of claim 1, wherein the FIFO memory is configured to store data at the output data signal and read out data stored in the FIFO memory, in response to a pulse on the output timing signal.

4. The continuous-time digital signal processor of claim 1, wherein the two channel memory is configured to output data stored in a first channel at the first intermediate data and to store data at the first data input into the first channel, in response to a pulse received on the first input timing signal, and further configured to output data stored in a second channel at the second intermediate data and to store data at the second data input into the second channel, in response to a pulse received on the second input timing signal.

5. The continuous-time digital signal processor of claim 1, wherein the first time delay block is configured to generate the output timing signal by delaying the intermediate timing signal by a first delay;
   wherein the second time delay block is configured to generate the second input timing signal by delaying the output timing signal by a second delay;

wherein the first delay is shorter than or equal to the second delay.

6. The continuous-time digital signal processor of claim 5, wherein the first delay is selected based on a propagation delay of the first operation block.

7. The continuous-time digital signal processor of claim 1, wherein the event-grouping block is configured to generate the intermediate timing signal by propagating a pulse at one of the first input timing signal and the second input timing signal.

8. The continuous-time digital signal processor of claim 1, wherein, when a pulse is received at the second input timing signal, within a time window from a pulse received at the first input timing signal, the event-grouping block is configured to generate the intermediate timing signal by delaying the second input timing signal by a third delay.

9. The continuous-time digital signal processor of claim 8, wherein the time window and the third delay are selected based on a propagation delay of the first operation block.

10. The continuous-time digital signal processor of claim 8, wherein the second delay is selected based on a feedback delay and the propagation delay of the first operation block.

11. The continuous-time digital signal processor of claim 1, wherein, when a pulse is received at the first input timing signal, within a time window from a pulse received at the second input timing signal, the event-grouping block is configured to generate the intermediate timing signal by delaying the first input timing signal by a third delay.

12. The continuous-time digital signal processor of claim 1, wherein the intermediate timing signal is generated when the first data input is different than a previous value of the first data input.

13. A method for continuous-time digital signal processing, comprising:
by an event-grouping block, receiving a first input timing signal, a second input timing signal, and generating an intermediate timing signal;
by a first time delay block, receiving the intermediate timing signal and generating an output timing signal;
by a second time delay block, receiving the output timing signal and generating the second input timing signal;
by a two-channel memory, receiving a first data input and a second data input and generating a first intermediate data signal and a second intermediate data signal;
by an arithmetic operation block, receiving the first intermediate data signal, the second intermediate data signal and generating an output data signal;
by a scalar block, receiving the second intermediate data signal and generating a scaled version of the second intermediate data signal;
by an adder, receiving the first intermediate data signal and the scaled version of the second intermediate data signal, and generating the output data signal; and
by a first-in-first-out (FIFO) memory, receiving the output data signal and generating the second input data signal.

14. The method of claim 13, further comprising, by the adder, receiving data at the first intermediate data signal and calculating the output data signal, in response to a pulse on the intermediate timing signal.

15. The method of claim 13, further comprising, by the FIFO memory, storing data at the output data signal and reading out data stored in the FIFO memory, in response to a pulse on the output timing signal.

16. The method of claim 13, further comprising:
by the two channel memory, providing data stored in a first channel at the first intermediate data and storing data at the first data input into the first channel, in response to a pulse received on the first input timing signal; and
by the two channel memory, providing data stored in a second channel at the second intermediate data and storing data at the second data input into the second channel, in response to a pulse received on the second input timing signal.

17. The method of claim 13, further comprising, by the first time delay block, generating the output timing signal by delaying the intermediate timing signal by a first delay;
wherein the second time delay block is configured to generate the second input timing signal by delaying the output timing signal by a second delay;
wherein the first delay is shorter than or equal to the second delay.

18. The method of claim 17, wherein the first delay is selected based on a propagation delay of the first operation block.

19. The method of claim 13, further comprising, by the event-grouping block, generating the intermediate timing signal by propagating a pulse at one of the first input timing signal and the second input timing signal.

20. The method of claim 13, further comprising, by the event-grouping block, generating the intermediate timing signal by delaying the second input timing signal by a third delay, when a pulse is received at the second input timing signal, within a time window from a pulse received at the first input timing signal.

21. The method of claim 20, wherein the time window and the third delay are selected based on a propagation delay of the first operation block.

22. The method of claim 20, wherein the second delay is selected based on a feedback delay and the propagation delay of the first operation block.

23. The method of claim 13, further comprising, by the event-grouping block, generating the intermediate timing signal by delaying the first input timing signal by a third delay, when a pulse is received at the first input timing signal, within a time window from a pulse received at the second input timing signal.

24. The method of claim 13, wherein the intermediate timing signal is generated when the first data input is different than a previous value of the first data input.

* * * * *

UNITED STATES PATENT AND TRADEMARK OFFICE
CERTIFICATE OF CORRECTION

PATENT NO. : 10,193,533 B2
APPLICATION NO. : 15/678424
DATED : January 29, 2019
INVENTOR(S) : Yu Chen et al.

It is certified that error appears in the above-identified patent and that said Letters Patent is hereby corrected as shown below:

In the Specification

Please add the following after Paragraph [0001]:
GOVERNMENT SUPPORT
This invention was made with government support under 1419949 and 0964606 awarded by the National Science Foundation. The government has certain rights in the invention.

Signed and Sealed this
Twenty-fifth Day of February, 2020

Andrei Iancu
*Director of the United States Patent and Trademark Office*